(12) United States Patent
Watanabe

(10) Patent No.: US 11,393,781 B2
(45) Date of Patent: Jul. 19, 2022

(54) SEMICONDUCTOR DEVICE AND MANUFACTURING METHOD THEREOF

(71) Applicant: Kioxia Corporation, Minato-ku (JP)

(72) Inventor: Takashi Watanabe, Yokkaichi (JP)

(73) Assignee: Kioxia Corporation, Minato-ku (JP)

( * ) Notice: Subject to any disclaimer, the term of this patent is extended or adjusted under 35 U.S.C. 154(b) by 37 days.

(21) Appl. No.: 17/009,346

(22) Filed: Sep. 1, 2020

(65) Prior Publication Data

US 2021/0280545 A1 Sep. 9, 2021

(30) Foreign Application Priority Data

Mar. 6, 2020 (JP) .............................. JP2020-039117

(51) Int. Cl.
| | |
|---|---|
| H01L 23/48 | (2006.01) |
| H01L 23/52 | (2006.01) |
| H01L 29/40 | (2006.01) |
| H01L 23/00 | (2006.01) |

(52) U.S. Cl.
CPC .............. *H01L 24/09* (2013.01); *H01L 24/03* (2013.01); *H01L 24/08* (2013.01); *H01L 24/80* (2013.01); *H01L 24/94* (2013.01); *H01L 2224/0362* (2013.01); *H01L 2224/03845* (2013.01); *H01L 2224/05073* (2013.01); *H01L 2224/05186* (2013.01); *H01L 2224/05573* (2013.01); *H01L 2224/05647* (2013.01); *H01L 2224/08145* (2013.01); *H01L 2224/0903* (2013.01); *H01L 2224/09132* (2013.01); *H01L 2224/09517* (2013.01); *H01L 2924/04953* (2013.01); *H01L 2924/30105* (2013.01)

(58) Field of Classification Search
CPC combination set(s) only.
See application file for complete search history.

(56) References Cited

U.S. PATENT DOCUMENTS

| | | |
|---|---|---|
| 10,050,018 B2 | 8/2018 | Wu et al. |
| 2007/0108574 A1 | 5/2007 | Kang et al. |
| 2014/0145338 A1 | 5/2014 | Fujii et al. |
| 2017/0250160 A1 | 8/2017 | Wu et al. |

(Continued)

FOREIGN PATENT DOCUMENTS

| | | |
|---|---|---|
| JP | 2011-222554 A | 11/2011 |
| JP | 2014-72487 A | 4/2014 |

(Continued)

*Primary Examiner* — Niki H Nguyen
(74) *Attorney, Agent, or Firm* — Oblon, McClelland, Maier & Neustadt, L.L.P.

(57) ABSTRACT

A semiconductor device according to an embodiment comprises a first chip and a second chip. The first chip includes a first wire, a first connection pad electrically connected to the first wire, and a first dummy pad. The second chip includes a second wire, a second connection pad electrically connected to the second wire and joined to the first connection pad, and a second dummy pad joined to the first dummy pad. A thickness of the first dummy pad is smaller than a thickness of the first connection pad and a thickness of the second dummy pad is also smaller than a thickness of the second connection pad, or the thickness of the first dummy pad is smaller than the thickness of the first connection pad or the thickness of the second dummy pad is smaller than the thickness of the second connection pad.

3 Claims, 27 Drawing Sheets

(56) References Cited

U.S. PATENT DOCUMENTS

| | | | |
|---|---|---|---|
| 2018/0145053 A1 | 5/2018 | Jung | |
| 2019/0096830 A1* | 3/2019 | Wei | H01L 27/14685 |
| 2019/0355707 A1 | 11/2019 | Lee et al. | |
| 2021/0043673 A1* | 2/2021 | Kwon | H01L 27/14636 |

FOREIGN PATENT DOCUMENTS

| | | | |
|---|---|---|---|
| JP | 2019-114595 A | 7/2019 | |
| TW | 201743430 A | 12/2017 | |
| WO | WO-2020175712 A2 * | 9/2020 | H01L 27/14603 |

* cited by examiner

11,393,781 B2

SEMICONDUCTOR DEVICE AND MANUFACTURING METHOD THEREOF

CROSS-REFERENCE TO RELATED APPLICATIONS

This application is based upon and claims the benefit of priority from Japanese Patent Application No. 2020-039117, filed on Mar. 6, 2020; the entire contents of which are incorporated herein by reference.

FIELD

The embodiments of the present invention relate to a semiconductor device and a manufacturing method thereof.

BACKGROUND

There is known a hybrid bonding technique that bonds two wafers with semiconductor elements formed thereon to each other. In the hybrid bonding technique, connection pads that are formed on surfaces of the respective wafers are joined to each other. A dummy pad may be arranged in order to avoid poor joining of these connection pads. In this case, there is a possibility that a parasitic capacitance is generated between a wire and the dummy pad.

DETAILED DESCRIPTION

Embodiments will now be explained with reference to the accompanying drawings. The present invention is not limited to the embodiments.

A semiconductor device according to an embodiment comprises a first chip and a second chip. The first chip includes a first wire, a first connection pad electrically connected to the first wire, and a first dummy pad. The second chip includes a second wire, a second connection pad electrically connected to the second wire and joined to the first connection pad, and a second dummy pad joined to the first dummy pad. A thickness of the first dummy pad is smaller than a thickness of the first connection pad and a thickness of the second dummy pad is also smaller than a thickness of the second connection pad, or the thickness of the first dummy pad is smaller than the thickness of the first connection pad or the thickness of the second dummy pad is smaller than the thickness of the second connection pad.

First Embodiment

Figure 1:
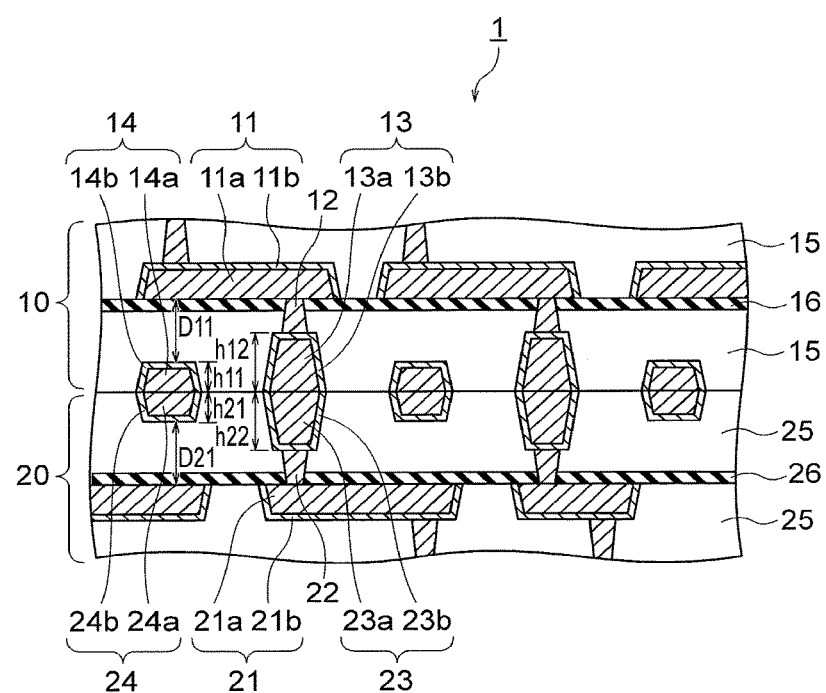
FIG. 1 is a cross-sectional view schematically illustrating a structure of relevant parts of a semiconductor device according to a first embodiment.

FIG. 1 is a cross-sectional view schematically illustrating a structure of relevant parts of a semiconductor device according to a first embodiment. In a semiconductor device 1 illustrated in FIG. 1, an array chip 10 and a circuit chip 20 are bonded to each other in the Z-direction. The array chip 10 is an example of a first chip, and the circuit chip 20 is an example of a second chip. The Z-direction is a vertical direction, and the X- and Y-directions are horizontal directions perpendicular to the Z-direction.

First, the array chip 10 is described. The array chip 10 includes a first wire 11, a first contact via 12, a first connection pad 13, and a first dummy pad 14. In addition to these members, the array chip 10 also includes memory cells having a three-dimensional structure, word lines, and bit lines.

The first wire 11 includes a metal film 11a and a barrier metal 11b. The metal film 11a contains copper (Cu), for example, and is formed on a stopper film 16. The stopper film 16 is a film containing silicon nitride (SiN), for example. The barrier metal 11b contains tantalum nitride (TaN), for example, and covers a surface of the metal film 11a. In the present embodiment, a plurality of the first wires 11 are formed on the stopper film 16. The first wires 11 are insulated from each other with an interlayer dielectric film 15 interposed therebetween.

The first contact via 12 contains tungsten, for example. One end of the first contact via 12 penetrates through the stopper film 16 and is in contact with the metal film 11a of the first wire 11. The other end of the first contact via 12 is in contact with a barrier metal 13b of the first connection pad 13.

The first connection pad 13 is electrically connected to the first wire 11 via the first contact via 12 and includes a metal film 13a and the barrier metal 13b. The metal film 13a contains copper, for example. The barrier metal 13b contains tantalum nitride, for example, and covers the metal film 13a.

In the present embodiment, a plurality of the first connection pads 13 are arranged under the first wires 11, respectively. The first connection pads 13 are insulated from each other with the interlayer dielectric film 15 interposed therebetween.

The first dummy pad 14 includes a metal film 14a and a barrier metal 14b. The metal film 14a contains copper, as with the metal film 13a. The barrier metal 14b contains tantalum nitride, as with the barrier metal 13b, and covers the metal film 14a.

In the present embodiment, the first dummy pad 14 and the first wire 11 are insulated from each other by the interlayer dielectric film 15 and the stopper film 16. That is, the first dummy pad 14 is not electrically connected to the first wire 11. A thickness h11 of the first dummy pad 14 from a joining surface with the circuit chip 20 is smaller than a thickness h12 of the first connection pad 13 from the joining surface with the circuit chip 20. For example, the thickness h11 is 300 nm and the thickness h12 is 500 nm.

Figure 2:
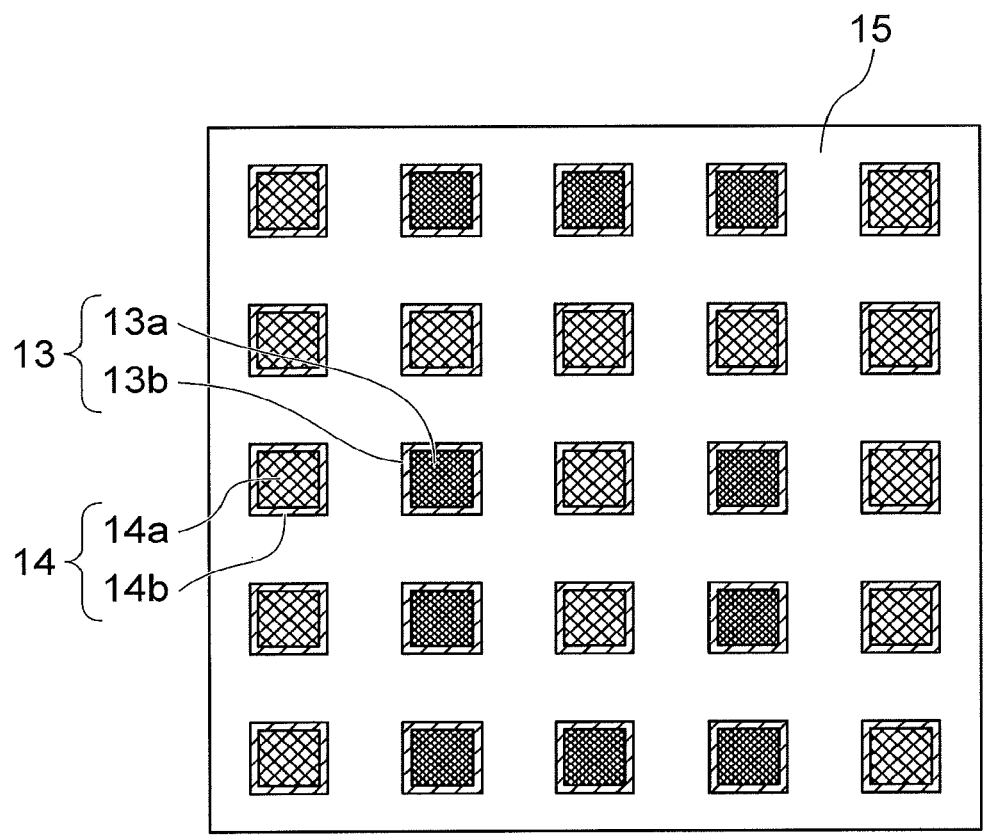
FIG. 2 is a plan view illustrating a layout example of connection pads and dummy pads.

FIG. 2 is a plan view illustrating a layout example of the first connection pads 13 and the first dummy pads 14. As illustrated in FIG. 2, the first connection pads 13 and the first dummy pads 14 are not necessarily arranged alternately. The first dummy pad 14 can be arranged in any gap area in which no first connection pad 13 is formed, in an area where the array chip 10 and the circuit chip 20 are joined to each other.

Next, the circuit chip 20 is described with reference to FIG. 1. The circuit chip 20 includes a second wire 21, a second contact via 22, a second connection pad 23, and a second dummy pad 24. In addition to these parts, the circuit chip 20 also includes driving elements (transistors, for example) for memory cells provided in the array chip 10, for example.

The second wire 21 is electrically connected to the above driving elements and includes a metal film 21a and a barrier metal 21b. The metal film 21a contains copper (Cu), for example, and is formed below a stopper film 26. The stopper film 26 is a film containing silicon nitride (SiN), for example. The barrier metal 21b contains tantalum nitride (TaN), for example, and covers a surface of the metal film 21a. In the present embodiment, a plurality of the second wires 21 are formed below the stopper film 26. The second wires 21 are insulated from each other with an interlayer dielectric film 25 interposed therebetween.

The second contact via 22 contains tungsten, for example. One end of the second contact via 22 penetrates through the stopper film 26 and is in contact with the metal film 21a of the second wire 21. The other end of the second contact via 22 is in contact with a barrier metal 23b of the second connection pad 23.

The second connection pad 23 is electrically connected to the second wire 21 via the second contact via 22 and includes a metal film 23a and the barrier metal 23b. The metal film 23a contains copper, as with the metal film 13a of the first connection pad 13, and is joined to the metal film 13a. The barrier metal 23b contains tantalum nitride, as with the barrier metal 13b of the first connection pad 13, and covers the metal film 23a and is joined to the barrier metal 13b.

In the present embodiment, a plurality of the second connection pads 23 are arranged above the second wires 21, respectively. The second connection pads 23 are insulated from each other with the interlayer dielectric film 25 interposed therebetween. A surface of joining of the first connection pad 13 and the second connection pad 23 is a square having a side of 1 μm.

The second dummy pad 24 includes a metal film 24a and a barrier metal 24b. The metal film 24a contains copper, as with the metal film 14a of the first dummy pad 14, and is joined to the metal film 14a. The barrier metal 24b contains tantalum nitride, as with the barrier metal 14b, and covers the metal film 24a and is joined to the barrier metal 14b.

In the present embodiment, the second dummy pad 24 and the second wire 21 are insulated from each other by the interlayer dielectric film 25 and the stopper film 26. That is, the second dummy pad 24 is not electrically connected to the second wire 21. A thickness h21 of the second dummy pad 24 from a joining surface with the array chip 10 is smaller than a thickness h22 of the second connection pad 23 from the joining surface with the array chip 10. For example, the thickness h21 is 300 nm, which is equal to the thickness h11, and the thickness h22 is 500 nm, which is equal to the thickness h12. Further, a surface of joining of the first dummy pad 14 and the second dummy pad 24 is also a square having a side of 1 μm, as with the surface of joining of the connection pads.

Figure 3:
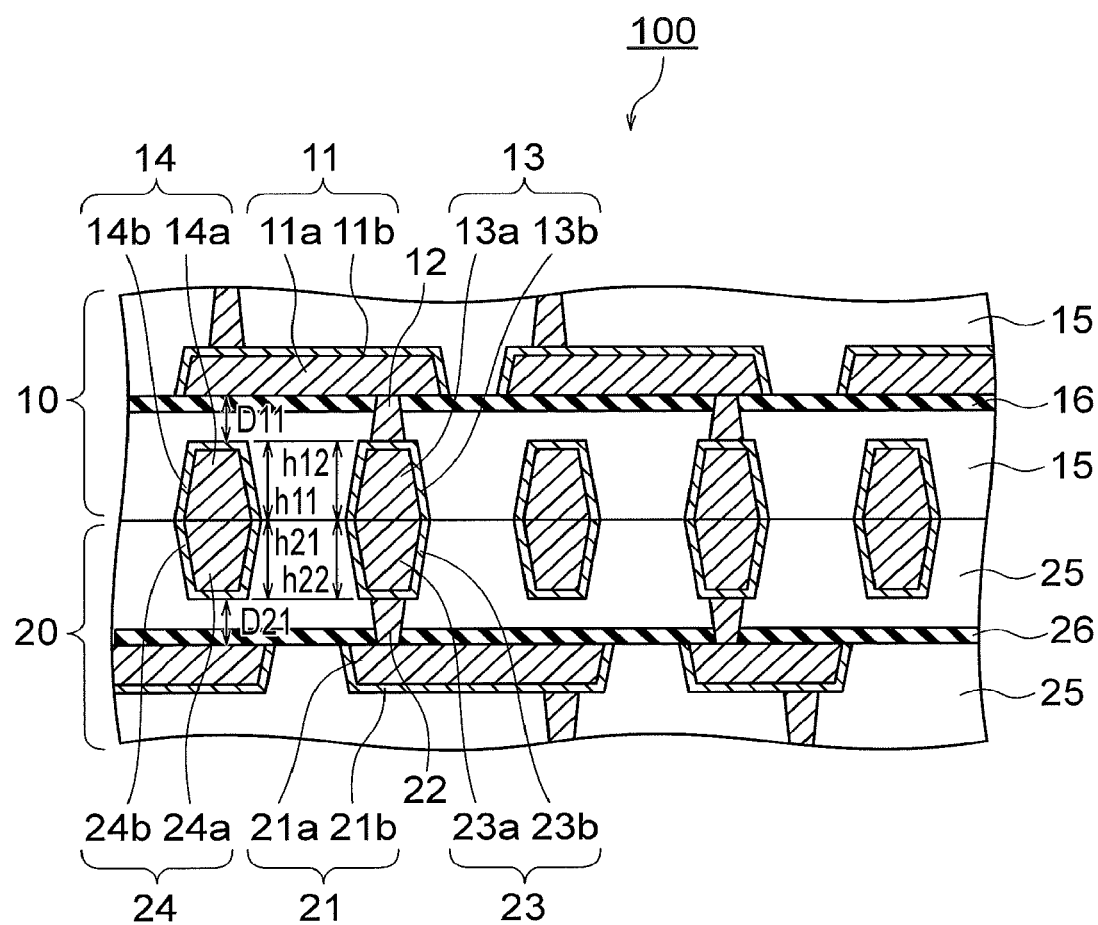
FIG. 3 is a cross-sectional view schematically illustrating a structure of relevant parts of a semiconductor device according to a comparative example.

FIG. 3 is a cross-sectional view schematically illustrating a structure of relevant parts of a semiconductor device according to a comparative example. Constituent elements identical to those of the semiconductor device 1 according to the first embodiment described above are denoted by like reference signs and detailed descriptions thereof are omitted.

In the array chip 10 of a semiconductor device 100 illustrated in FIG. 3, because the thickness h11 of the first dummy pad 14 is equal to the thickness h12 of the first connection pad 13, a distance D11 between the first dummy pad 14 and the first wire 11 is short. Therefore, a parasitic capacitance between the first dummy pad 14 and the first wire 11 is large. Also in the circuit chip 20, because the thickness h21 of the second dummy pad 24 is equal the thickness h22 of the second connection pad 23, a distance D21 between the second dummy pad 24 and the second wire 21 is short. As a result, a parasitic capacitance between the second dummy pad 24 and the second wire 21 is also large.

Meanwhile, in the array chip 10 according to the present embodiment, because the thickness h11 of the first dummy pad 14 is smaller than the thickness h12 of the first connection pad 13 as illustrated in FIG. 1, the distance D11 between the first dummy pad 14 and the first wire 11 is longer than that in the comparative example. Therefore, the parasitic capacitance between the first dummy pad 14 and the first wire 11 is reduced. Also in the circuit chip 20, because the thickness h21 of the second dummy pad 24 is smaller than the thickness h22 of the second connection pad 23, the distance D21 between the second dummy pad 24 and the second wire 21 is longer than that in the comparative example. As a result, the parasitic capacitance between the second dummy pad 24 and the second wire 21 is also reduced.

Therefore, according to the present embodiment, a parasitic capacitance between a dummy pad and a wire is reduced, and thus it is possible to avoid a trouble caused by this parasitic capacitance.

Second Embodiment

Figure 4:
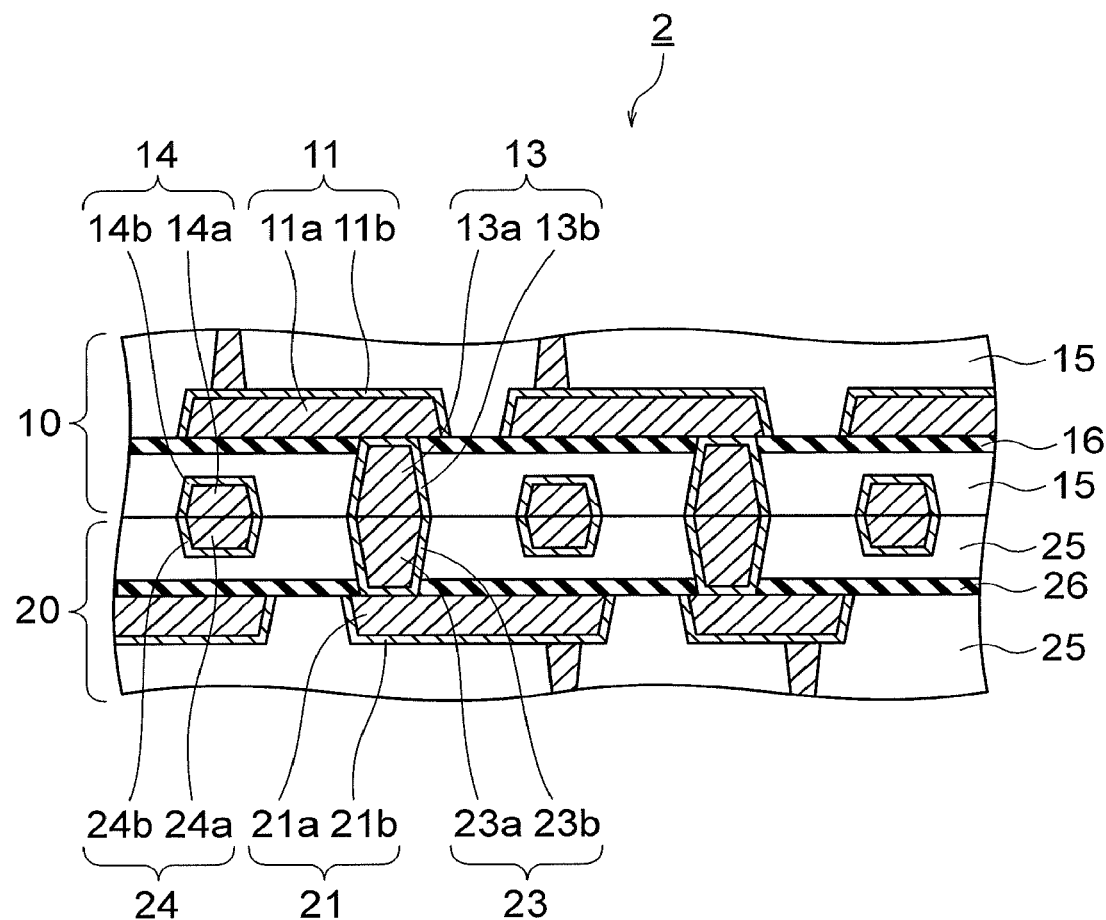
FIG. 4 is a cross-sectional view schematically illustrating a structure of relevant parts of a semiconductor device according to a second embodiment.

FIG. 4 is a cross-sectional view schematically illustrating a structure of relevant parts of a semiconductor device according to a second embodiment. Constituent elements identical to those of the semiconductor device 1 according to the first embodiment described above are denoted by like reference signs and detailed descriptions thereof are omitted.

A semiconductor device 2 according to the present embodiment has a via-less structure. That is, the first connection par 13 is connected directly to the first wire 11 not via the first contact via 12 in the array chip 10, and the second connection pad 23 is connected directly to the second wire 21 not via the second contact via 22 in the circuit chip 20.

Further, in the present embodiment, the thickness of the first dummy pad 14 is smaller than the thickness of the first connection pad 13 and the thickness of the second dummy pad 24 is also smaller than the thickness of the second connection pad 23, as in the first embodiment. If the thickness of the first dummy pad 14 is equal to the thickness of the first connection pad 13 and the thickness of the second dummy pad 24 is equal to the thickness of the second connection pad 23 in the present embodiment, the first wire 11 and the second wire 21 that are supposed to be insulated from each other are connected to each other via the first dummy pad 14 and the second dummy pad 24, causing a short circuit.

Therefore, in the present embodiment, the thickness of each dummy pad is made smaller than the thickness of each connection pad, thereby preventing contact between each dummy pad and each wire. Accordingly, it is possible to prevent a short circuit caused by the first dummy pad 14 and the second dummy pad 24.

Third Embodiment

Figure 5:
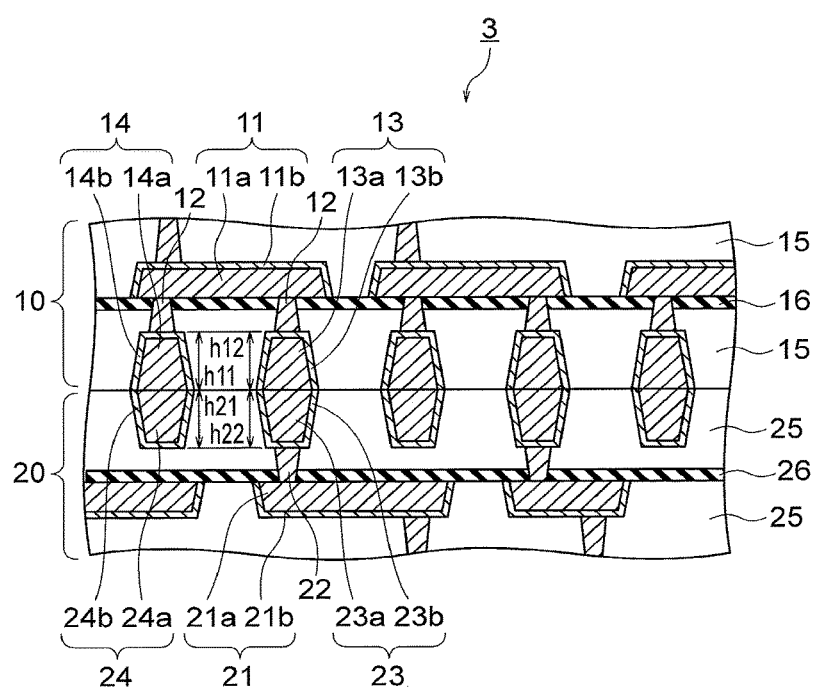
FIG. 5 is a cross-sectional view schematically illustrating a structure of relevant parts of a semiconductor device according to a third embodiment.

FIG. 5 is a cross-sectional view schematically illustrating a structure of relevant parts of a semiconductor device according to a third embodiment. Constituent elements identical to those of the semiconductor device 1 according to the first embodiment described above are denoted by like reference signs and detailed descriptions thereof are omitted.

In the array chip 10 of a semiconductor device 3 illustrated in FIG. 5, the thickness h11 of the first dummy pad 14 is equal to the thickness h12 of the first connection pad 13. The first dummy pad 14 is connected to the first wire 11 via the first contact via 12. In the circuit chip 20, while the thickness h21 of the second dummy pad 24 is equal to the thickness h22 of the second connection pad 23, the second dummy pad 24 is not connected to the second wire 21.

Here, the semiconductor device 3 is compared with the semiconductor device 100 according to the comparative example illustrated in FIG. 3, regarding a parasitic capacitance between the first dummy pad 14 and the first wire 11. In the semiconductor device 100, the potential of the first dummy pad 14 is in a floating state because the first dummy pad 14 is not connected to the first wire 11.

Meanwhile, in the present embodiment, because the first dummy pad 14 is electrically connected to the first wire 11 as illustrated in FIG. 5, there is almost no potential difference between the first dummy pad 14 and the first wire 11. Therefore, a parasitic capacitance is reduced. Consequently, it is possible to avoid a trouble caused by this parasitic capacitance.

Further, in the present embodiment, because the second dummy pad 24 is not electrically connected to the second wire 21, a state of the first wire 11 and the second wire 21 that are supposed to be insulated from each other is maintained. Therefore, it is also possible to avoid a short circuit of wires via the first dummy pad 14 and the second dummy pad 24. In the present embodiment, it is also allowable that the first dummy pad 14 is not electrically connected to the first wire 11 and the second dummy pad 24 is electrically connected to the second wire 21.

(First Modification)

Figure 6:
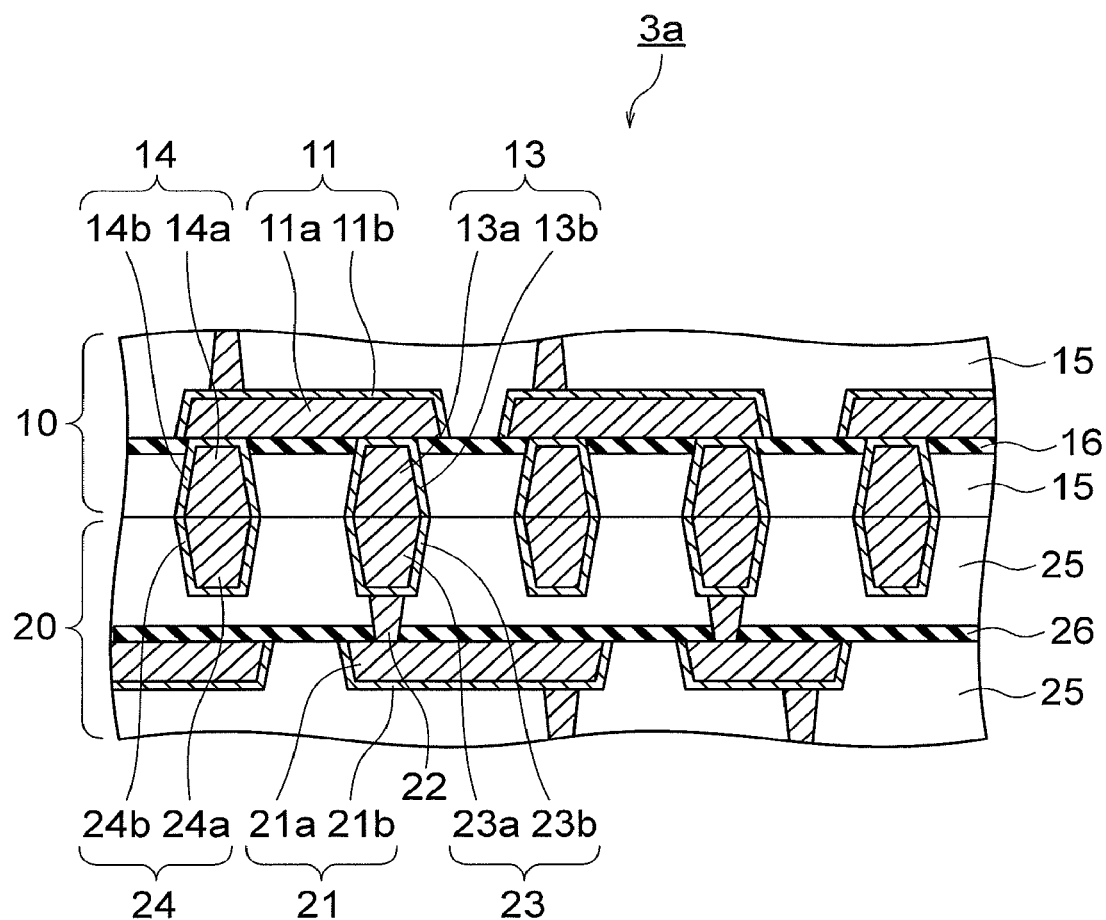
FIG. 6 is a cross-sectional view schematically illustrating a structure of relevant parts of a semiconductor device according to a modification of the third embodiment.

FIG. 6 is a cross-sectional view schematically illustrating a structure of relevant parts of a semiconductor device according to a modification of the third embodiment. Constituent elements identical to those of the semiconductor device 3 according to the third embodiment described above are denoted by like reference signs and detailed descriptions thereof are omitted.

In the array chip 10 in a semiconductor device 3a illustrated in FIG. 6, the first connection pad 13 and the first dummy pad 14 are connected directly to the first wire 11 not via the first contact via 12. Meanwhile, in the circuit chip 20, although the second connection pad 23 is connected to the second wire 21 via the second contact via 22, the second dummy pad 24 is not connected to the second wire 21.

Also in the present modification configured in the manner described above, there is almost no potential difference between the first dummy pad 14 and the first wire 11 and thus a parasitic capacitance between them is reduced, as in the third embodiment. Therefore, it is possible to avoid a trouble caused by this parasitic capacitance. Further, because the second dummy pad 24 is not electrically connected to the second wire 21, it is also possible to avoid a short circuit between the first wire 11 and the second wire 21. In the present modification, it is also allowable that the first dummy pad 14 is not electrically connected to the first wire 11 and the second dummy pad 24 is connected directly to the second wire 21.

(Second Modification)

Figure 7:
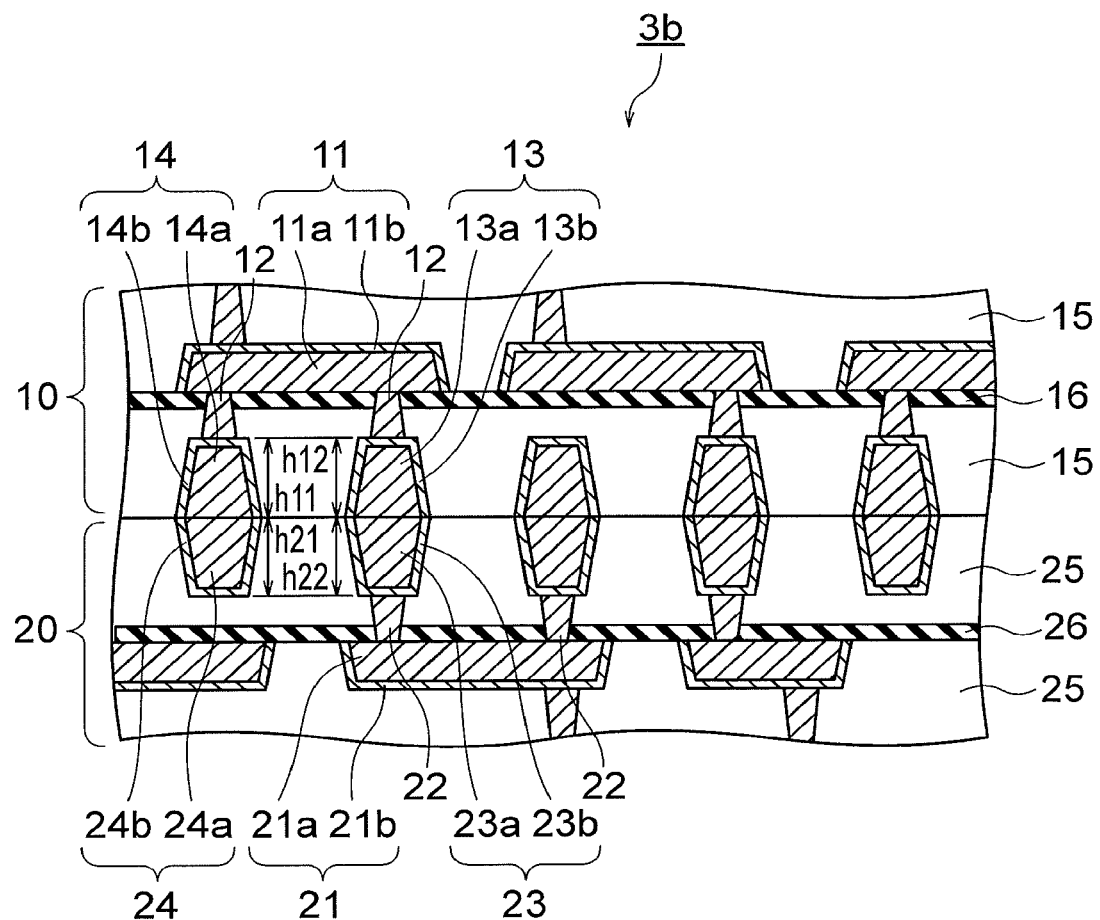
FIG. 7 is a cross-sectional view schematically illustrating a structure of relevant parts of a semiconductor device according to another modification of the third embodiment.

FIG. 7 is a cross-sectional view schematically illustrating a structure of relevant parts of a semiconductor device according to another modification of the third embodiment. Constituent elements identical to those of the semiconductor device 3 according to the third embodiment described above are denoted by like reference signs and detailed descriptions thereof are omitted.

In a semiconductor device 3b illustrated in FIG. 7, the first dummy pad 14 and the second dummy pad 24 joined to each other are connected to only either one of the first wire 11 and the second wire 21 via the first contact via 12 or the second contact via 22. In a case where the second dummy pad 24 is connected to the second wire 21 via the second contact via 22, there is almost no potential difference between the second dummy pad 24 and the second wire 21 and therefore a parasitic capacitance can be reduced. In this case, because the first dummy pad 14 is not connected to the first wire 11, it is also possible to avoid a short circuit between the first wire 11 and the second wire 21.

In the present modification, in order to determine to which one of the first wire 11 and the second wire 21 the first dummy pad 14 and the second dummy pad 24 joined to each other are connected, it suffices to simulate a value of a parasitic capacitance of the respective wires and to select a wire that provides a smaller value.

Fourth Embodiment

Figure 8:
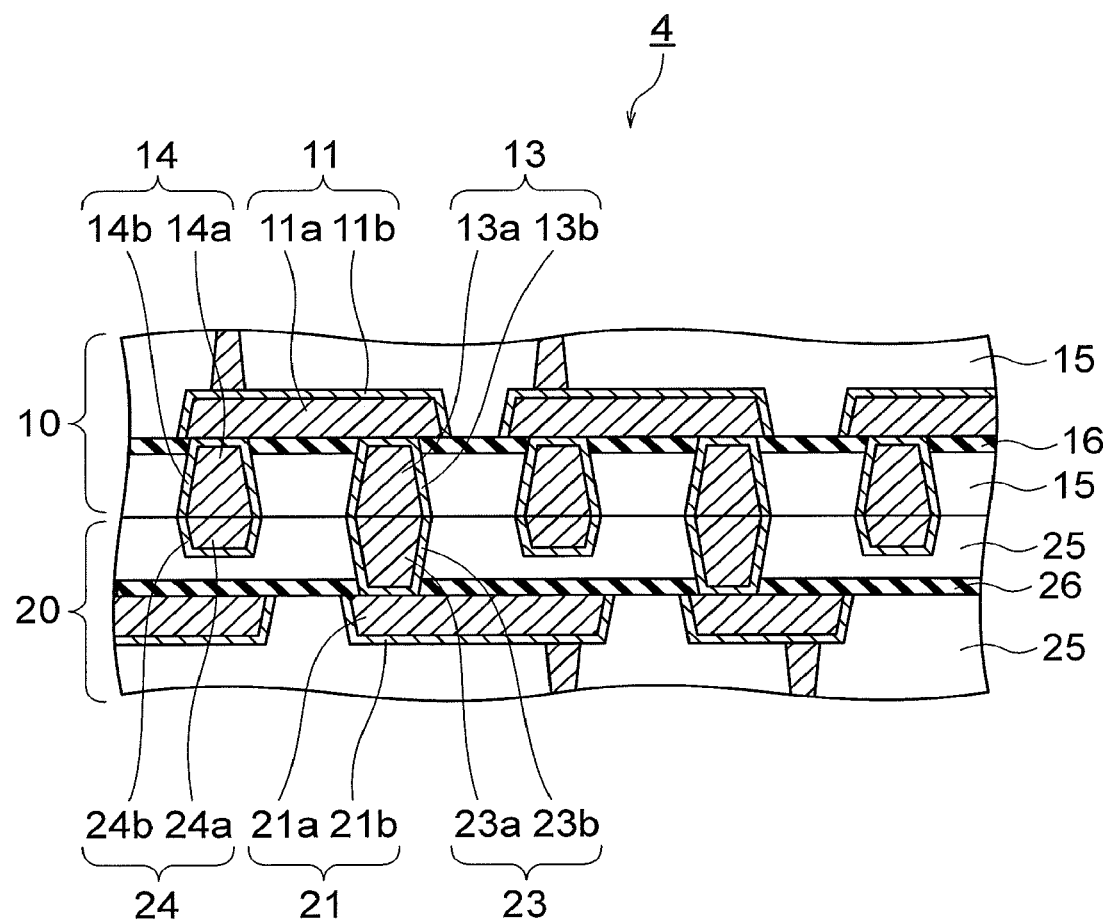
FIG. 8 is a cross-sectional view schematically illustrating a structure of relevant parts of a semiconductor device according to a fourth embodiment.

FIG. 8 is a cross-sectional view schematically illustrating a structure of relevant parts of a semiconductor device according to a fourth embodiment. Constituent elements identical to those of the semiconductor device 1 according to the first embodiment described above are denoted by like reference signs and detailed descriptions thereof are omitted.

In the array chip 10 of a semiconductor device 4 illustrated in FIG. 8, the thickness of the first dummy pad 14 is equal to the thickness of the first connection pad 13. Further, the first dummy pad 14 and the first connection pad 13 are in contact with the first wire 11 not via the first contact via 12.

Meanwhile, in the circuit chip 20, the thickness of the second dummy pad 24 is smaller than that of the second connection pad 23. The thickness of the second connection pad 23 is 500 nm, for example, and the thickness of the second dummy pad 24 is 300 nm, for example. Further, while the second connection pad 23 is in contact with the second wire 21, the second dummy pad 24 is not connected to the second wire 21.

According to the present embodiment, because the first dummy pad 14 is connected to the first wire 11, a parasitic capacitance between them can be reduced. Further, because the thickness of the second dummy pad 24 is smaller than the thickness of the second connection pad 23, a parasitic capacitance between the second dummy pad 24 and the second wire 21 can also be reduced. Furthermore, because the second dummy pad 24 is not connected to the second wire 21, it is also possible to prevent a short circuit between the first wire 11 and the second wire 21 caused by the first dummy pad 14 and the second dummy pad 24. In the present embodiment, it is also allowable that the thickness of the first dummy pad 14 is smaller than the thickness of the first connection pad 13 and the thickness of the second dummy pad 24 is equal to the thickness of the second connection pad 23.

(Third Modification)

Figure 9:
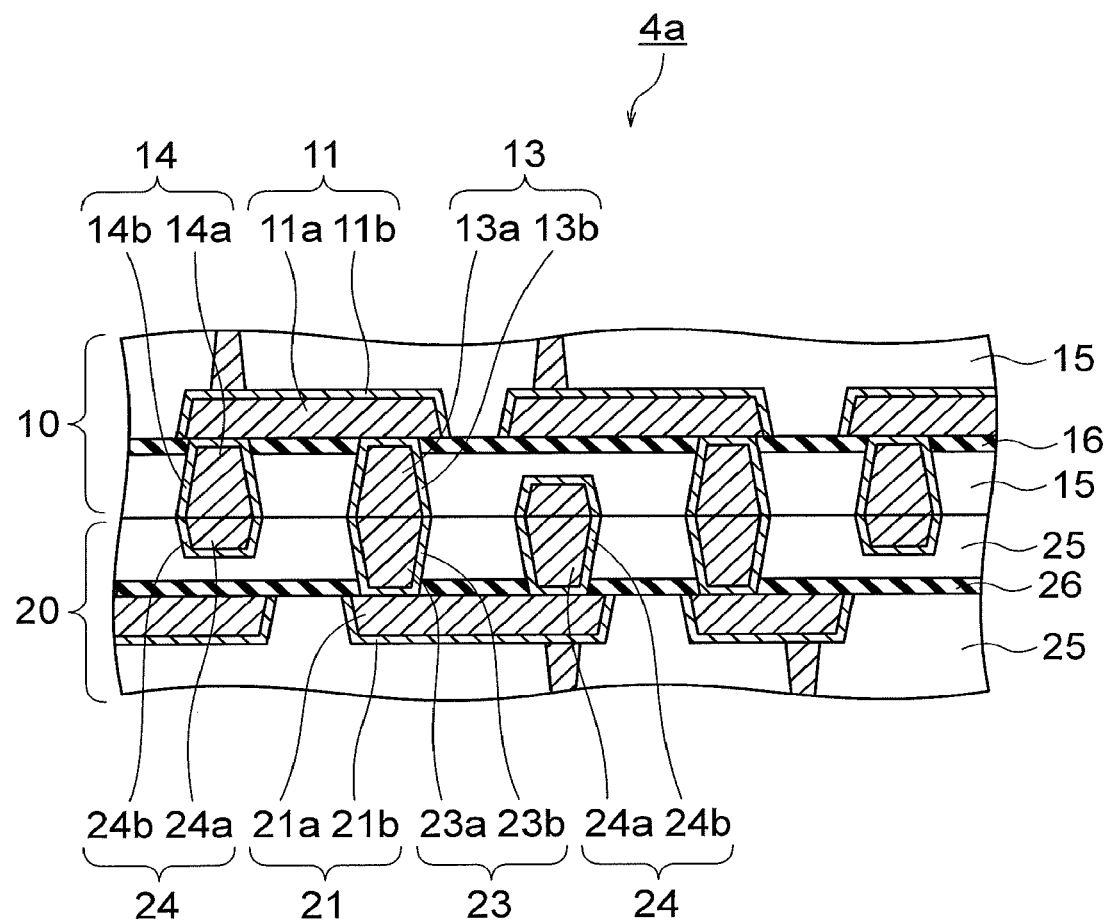
FIG. 9 is a cross-sectional view schematically illustrating a structure of relevant parts of a semiconductor device according to a modification of the fourth embodiment.

FIG. 9 is a cross-sectional view schematically illustrating a structure of relevant parts of a semiconductor device according to a modification of the fourth embodiment. Constituent elements identical to those of the semiconductor device 4 according to the fourth embodiment described above are denoted by like reference signs and detailed descriptions thereof are omitted.

In a semiconductor device 4a illustrated in FIG. 9, the first dummy pad 14 and the second dummy pad 24 joined to each other are connected directly to only either one of the first wire 11 and the second wire 21. In a case where the second dummy pad 24 is in contact with the second wire 21, there is almost no potential difference between them and thus a parasitic capacitance can be reduced.

Further, in the present embodiment, because the thickness of the first dummy pad 14 is smaller than the thickness of the first connection pad 13, a parasitic capacitance between the first dummy pad 14 and the first wire 11 can also be reduced. Furthermore, because the first dummy pad 14 is not connected to the first wire 11, it is also possible to prevent a short circuit between the first wire 11 and the second wire 21 via the first dummy pad 14 and the second dummy pad 24.

In the present modification, in order to determine to which one of the first wire 11 and the second wire 21 the first dummy pad 14 and the second dummy pad 24 joined to each other are connected directly, it suffices to simulate a value of a parasitic capacitance of the respective wires and to select a wire that provides a smaller value.

Fifth Embodiment

In a fifth embodiment, an example of a manufacturing method of the semiconductor device 1 according to the first embodiment described above is described with reference to FIGS. 10A to 10J.

Figure 10A:
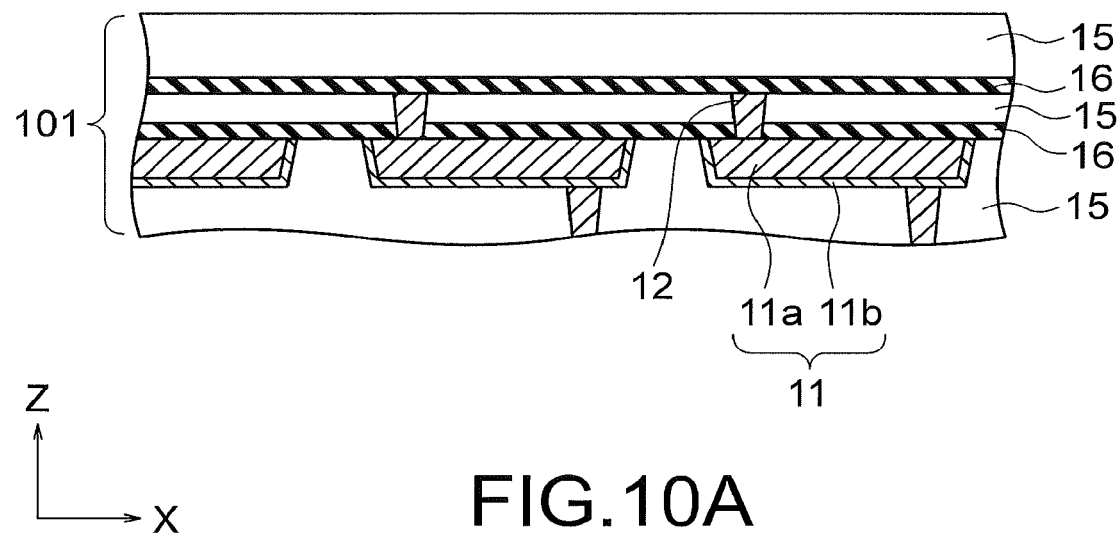
FIG. 10A is a cross-sectional view illustrating a process of stacking a stopper film and an interlayer dielectric film.

First, as illustrated in FIG. 10A, the first wire 11 and the first contact via 12 are formed on a plurality of memory cell arrays having a three-dimensional structure formed on an array wafer 101 (a substrate). Subsequently, the stopper film 16 and the interlayer dielectric film 15 are stacked on these components. The first wire 11 and the first contact via 12 can be formed by a method that is usually used, and therefore descriptions of how to form these components are omitted.

The stopper film 16 formed on the first contact via 12 is a silicon nitride film having a thickness of 50 nm, for example. The interlayer dielectric film 15 formed on the stopper film 16 is a silicon oxide film having a thickness of 550 nm, for example.

Figure 10B:
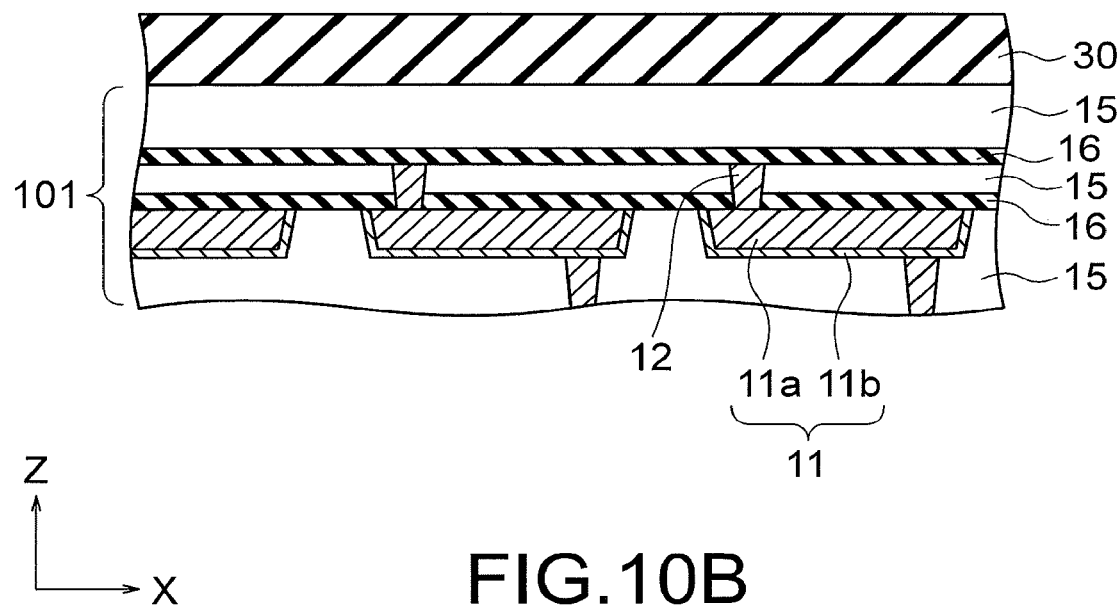
FIG. 10B is a cross-sectional view illustrating a process of forming a resist on the interlayer dielectric film.

Next, a resist 30 is formed on the interlayer dielectric film 15, as illustrated in FIG. 10B.

Figure 10C:
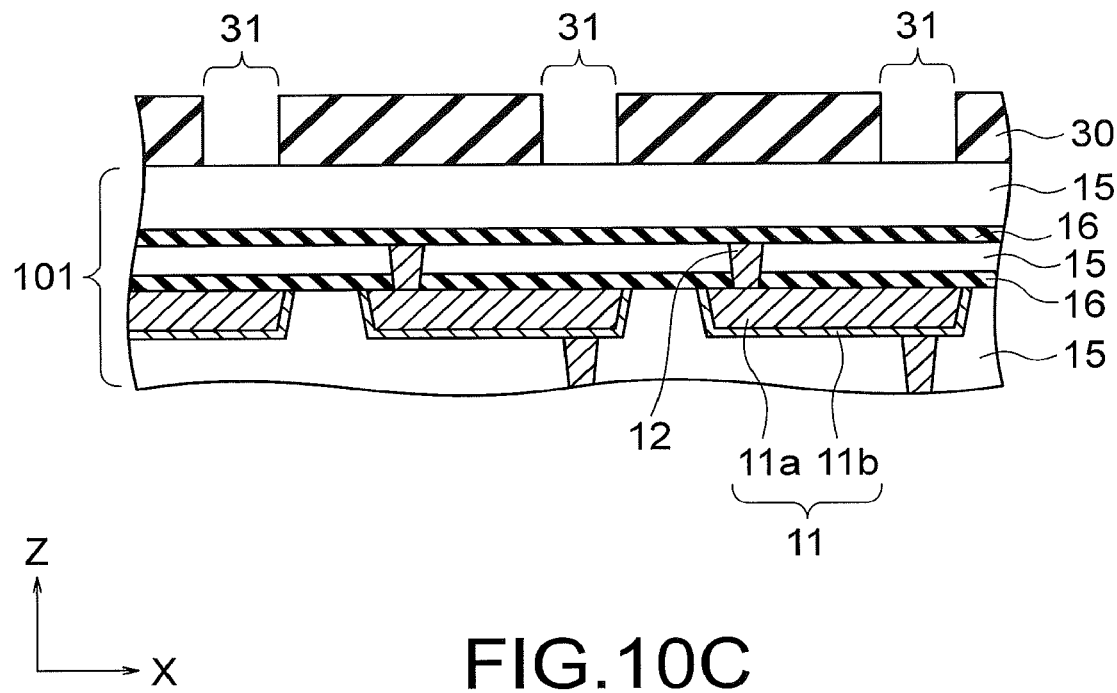
FIG. 10C is a cross-sectional view illustrating a process of forming a pattern including a concave portion in the resist.

Next, a pattern including a concave portion 31 is formed in the resist 30 by lithography, as illustrated in FIG. 10C. The concave portion 31 is located above an area in the interlayer dielectric film 15 where the first dummy pad 14 is to be formed.

Figure 10D:
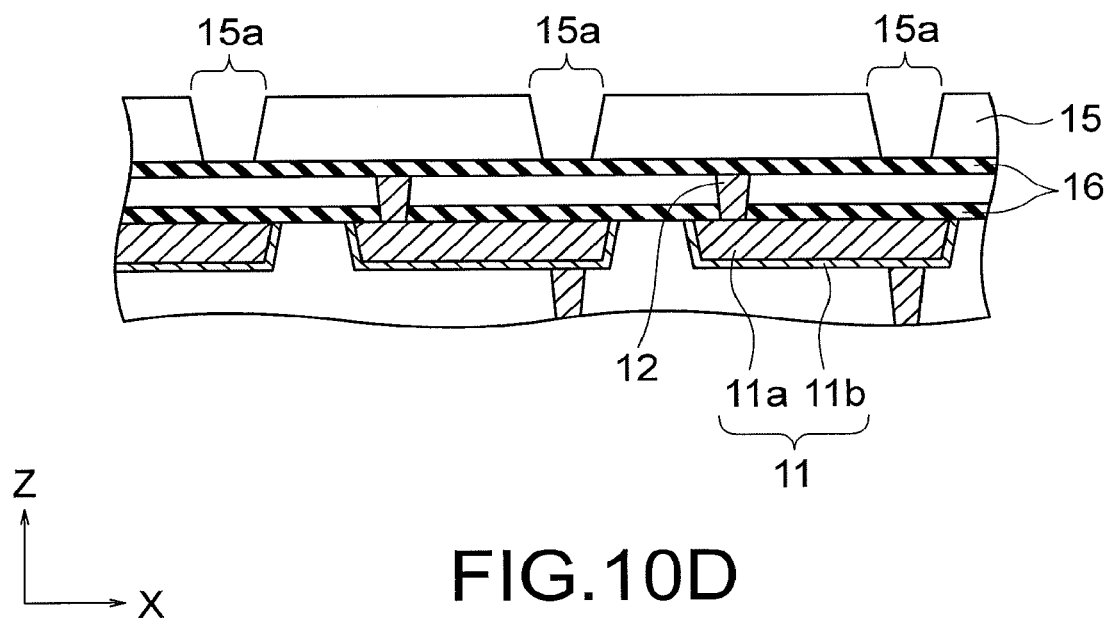
FIG. 10D is a cross-sectional view illustrating a process of removing the interlayer dielectric film using the resist as a mask.

Next, dry etching is performed by using the resist 30 as a mask to remove the interlayer dielectric film 15 until the stopper film 16 is exposed, as illustrated in FIG. 10D. Accordingly, a concave portion 15a for forming the first dummy pad 14 is formed in the interlayer dielectric film 15.

Figure 10E:
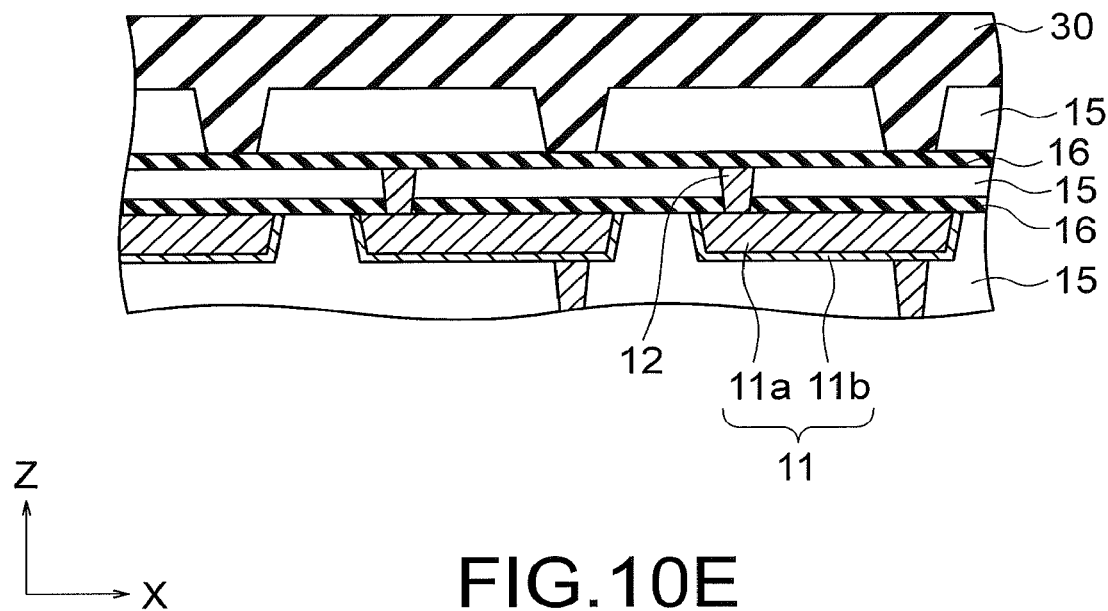
FIG. 10E is a cross-sectional view illustrating a process of forming the resist on the interlayer dielectric film again.

Next, the resist 30 is formed on the interlayer dielectric film 15 again, as illustrated in FIG. 10E. At this time, the resist 30 is embedded in the concave portion 15a.

Figure 10F:
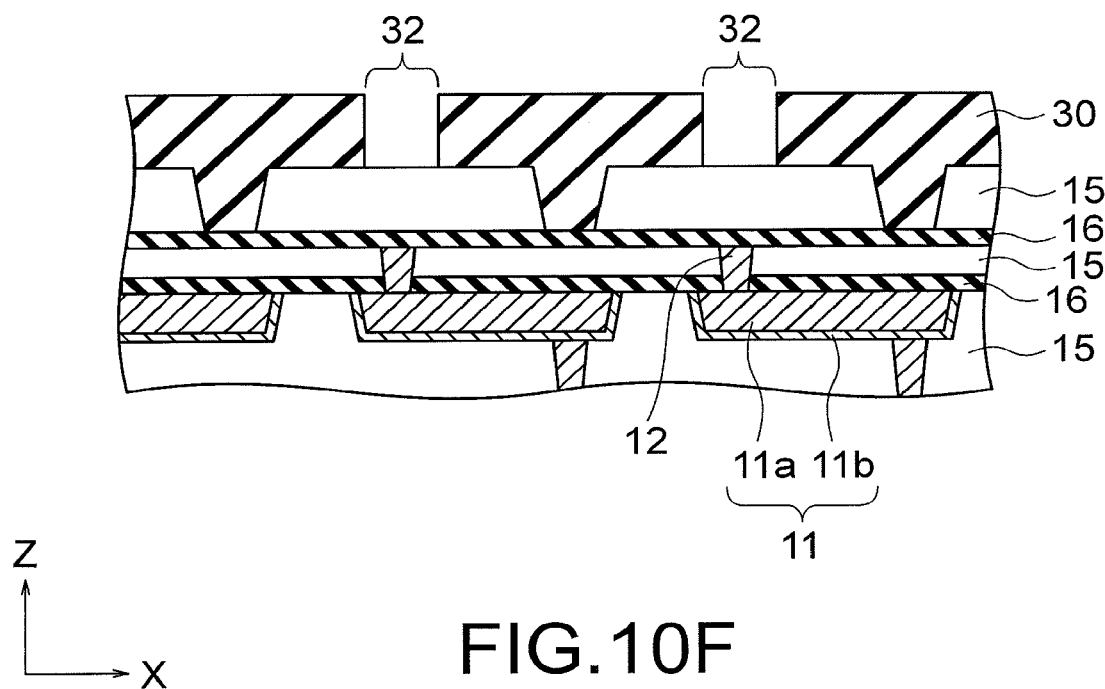
FIG. 10F is a cross-sectional view illustrating a process of forming a pattern including a concave portion in the resist.

Next, a pattern including a concave portion 32 is formed in the resist 30 by lithography, as illustrated in FIG. 10F. The concave portion 32 is located above an area in the interlayer dielectric film 15 where the first connection pad 13 is to be formed.

Figure 10G:
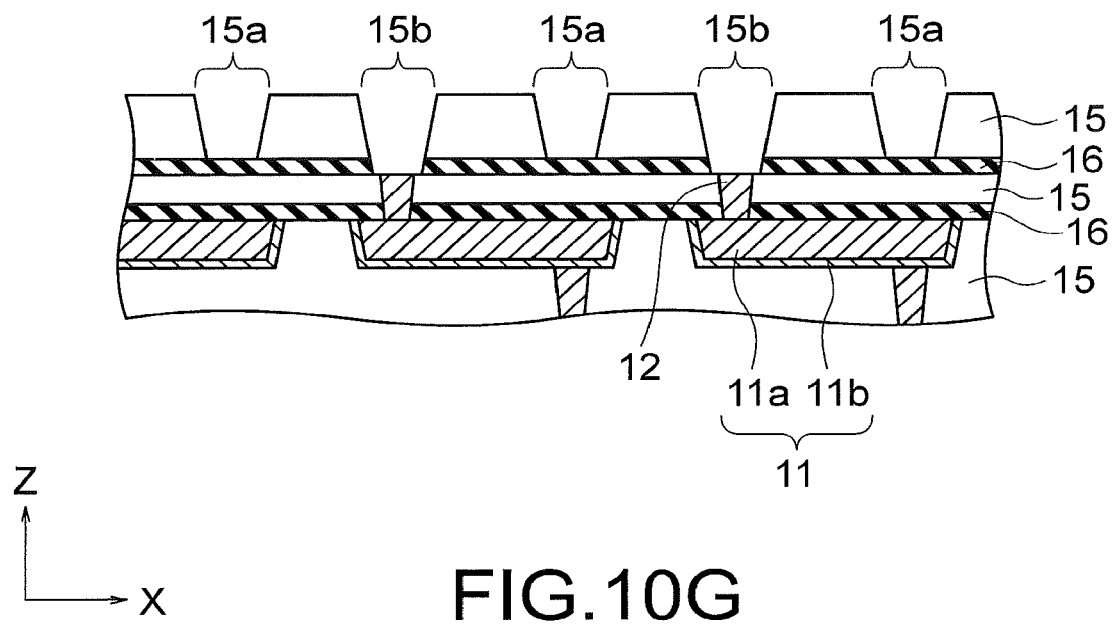
FIG. 10G is a cross-sectional view illustrating a process of removing the interlayer dielectric film and the stopper film using the resist as a mask.

Next, dry etching is performed by using the resist 30 as a mask to remove the interlayer dielectric film 15 and the stopper film 16 until the first contact via 12 is exposed, as illustrated in FIG. 10G. Accordingly, a concave portion 15b for forming the first connection pad 13 is formed in the interlayer dielectric film 15. At this time, the resist 30 embedded in the concave portion 15a is removed, so that the concave portion 15a is exposed again.

Figure 10H:
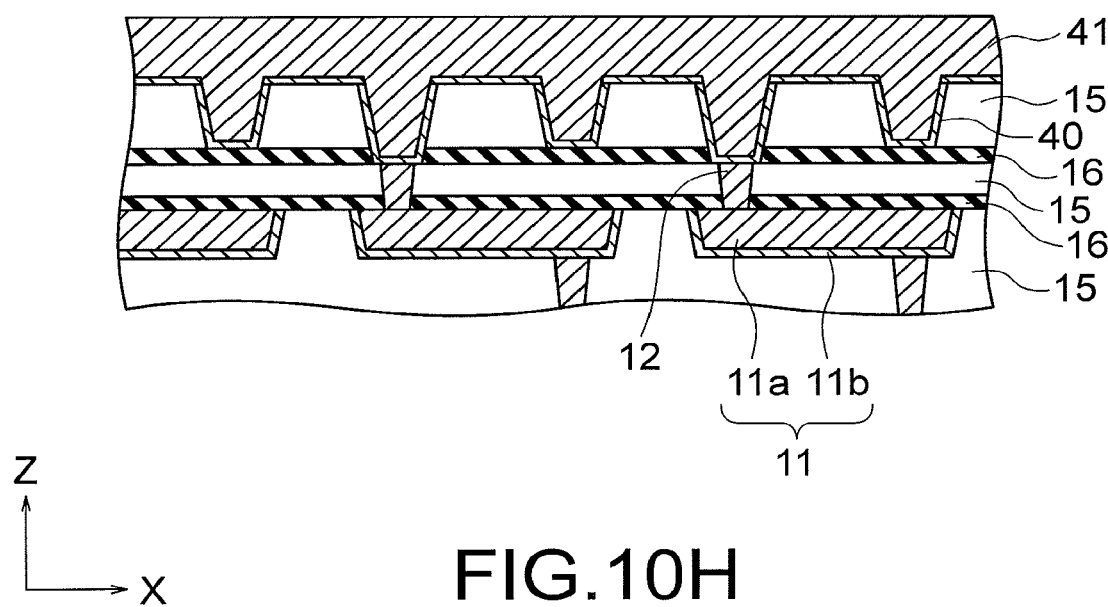
FIG. 10H is a cross-sectional view illustrating a process of forming a barrier metal and then embedding a metal film.

Next, a barrier metal 40 is formed on surfaces of the concave portions 15a and 15b, and a metal film 41 is then embedded in the concave portions 15a and 15b, as illustrated in FIG. 10H. For example, the barrier metal 40 is a tantalum nitride film and the metal film 41 is a copper film.

Figure 10I:
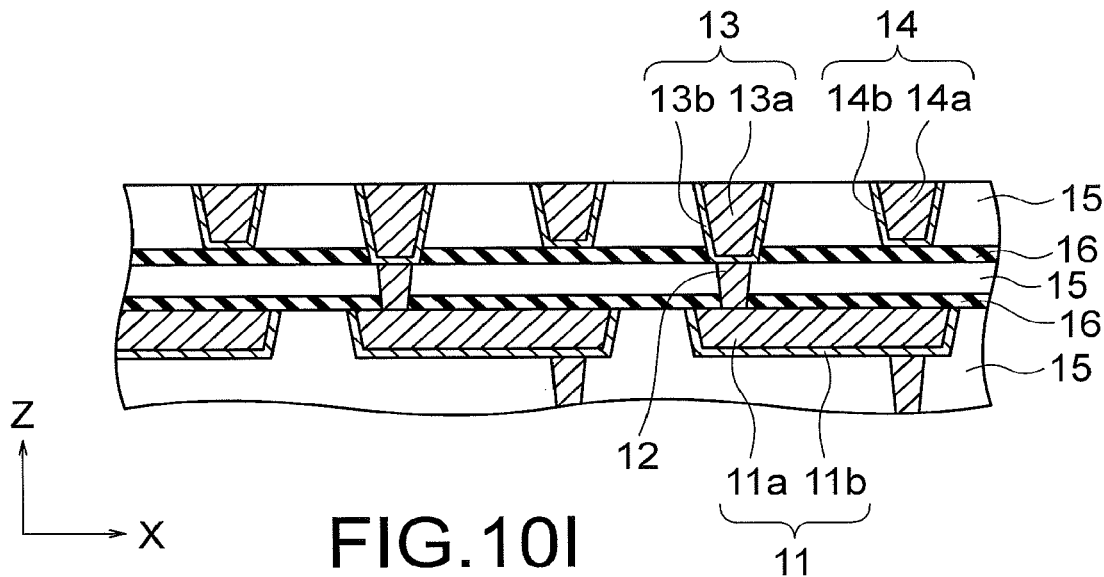
FIG. 10I is a cross-sectional view illustrating a process of removing extra portions of the metal film and the barrier metal.

Next, as illustrated in FIG. 10I, a CMP (Chemical Mechanical Polishing) process is performed to remove extra portions of the metal film 41 and the barrier metal 40 and to remove the interlayer dielectric film 15 by, for example, 100 nm. Consequently, the first connection pad 13 and the first dummy pad 14 are formed in the interlayer dielectric film 15. In the present embodiment, it is possible to prevent generation of a step in the CMP process because of the presence of the first dummy pad 14.

Figure 10J:
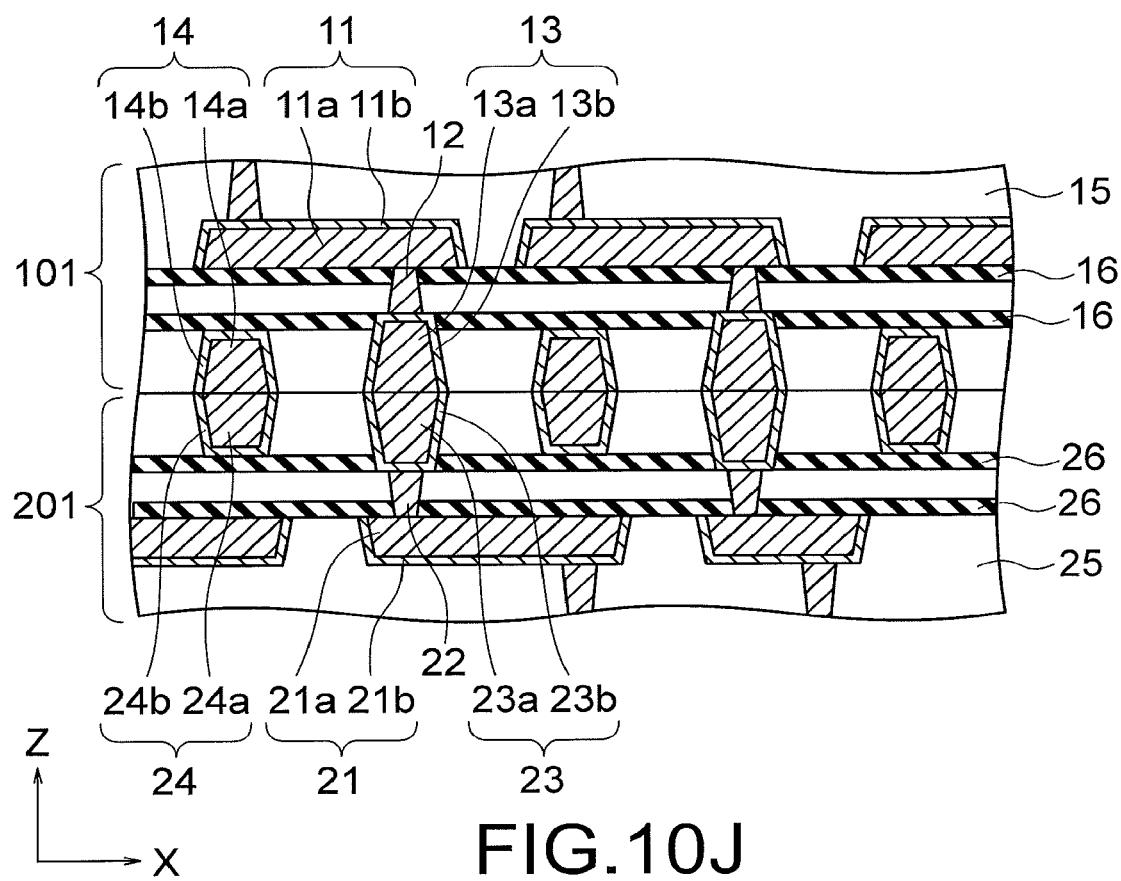
FIG. 10J is a cross-sectional view illustrating a process of bonding an array wafer to a circuit wafer.

Next, as illustrated in FIG. 10J, the array wafer 101 is inverted by 180 degrees and is bonded to a circuit wafer 201. Thereafter, the first connection pad 13 and the first dummy pad 14 of the array wafer 101 are joined to the second connection pad 23 and the second dummy pad 24 of the circuit wafer 201 by heat treatment, respectively. The second connection pad 23 and the second dummy pad 24 are formed in an identical manner to the first connection pad 13 and the first dummy pad 14 described above, before being bonded to the array wafer 101.

Thereafter, the array wafer 101 and the circuit wafer 201 bonded to each other are subjected to dicing, so that the semiconductor device 1 formed by the array chip 10 and the circuit chip 20 is completed.

According to the present embodiment, the first dummy pad 14 is formed in a step other than a step of forming the first connection pad 13. Therefore, it is possible to make the thickness of the first dummy pad 14 smaller than the thickness of the first connection pad 13. Further, because the second dummy pad 24 is also formed in an identical manner to the first dummy pad 14, it is also possible to make the thickness of the second dummy pad 24 smaller than the thickness of the second connection pad 23. Furthermore, according to the present embodiment, the thickness of a dummy pad is made smaller than the thickness of a connection pad by forming the dummy pad and the connection pad in separate steps from each other in both the array wafer 101 and the circuit wafer 201. Alternatively, by forming the dummy pad and the connection pad in separate steps from each other in only either the array wafer 101 or the circuit wafer 201, the thickness of the dummy pad may be made smaller than the thickness of the connection pad in only either one of the wafers.

Although the stopper films 16 and 26 are used for forming the first dummy pad 14 and the second dummy pad 24 in the present embodiment, it is also allowable that the stopper films 16 and 26 are not used. In the semiconductor device 1 illustrated in FIG. 1, the first dummy pad 14 and the second dummy pad 24 are formed without using the stopper films 16 and 26. In a case where the stopper films 16 and 26 are not used, it is possible to control the thickness of each dummy pad by adjusting an etching time of the interlayer dielectric film 15.

Sixth Embodiment

In a sixth embodiment, an example of a manufacturing method of a semiconductor device having a via-less structure is described with reference to FIGS. 11A to 11J.

Figure 11A:
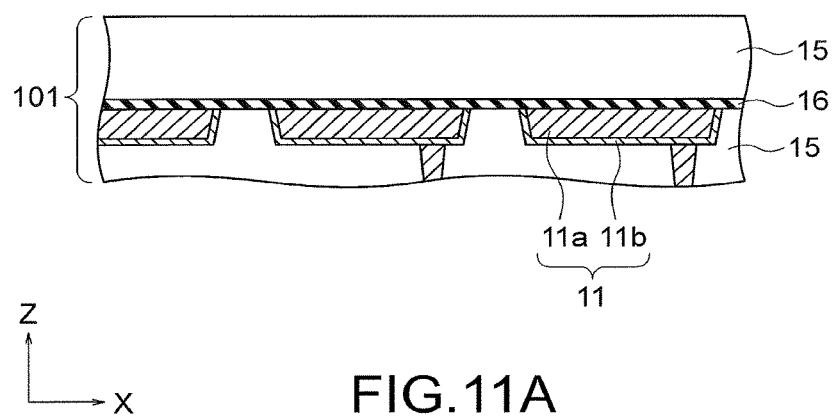
FIG. 11A is a cross-sectional view illustrating a process of stacking the stopper film and the interlayer dielectric film.

First, as illustrated in FIG. 11A, the stopper film 16 and the interlayer dielectric film 15 are stacked on the first wire 11 of the array wafer 101. The stopper film 16 is a silicon nitride film having a thickness of 50 nm, for example. The interlayer dielectric film 15 is a silicon oxide film having a thickness of 550 nm, for example.

Figure 11B:
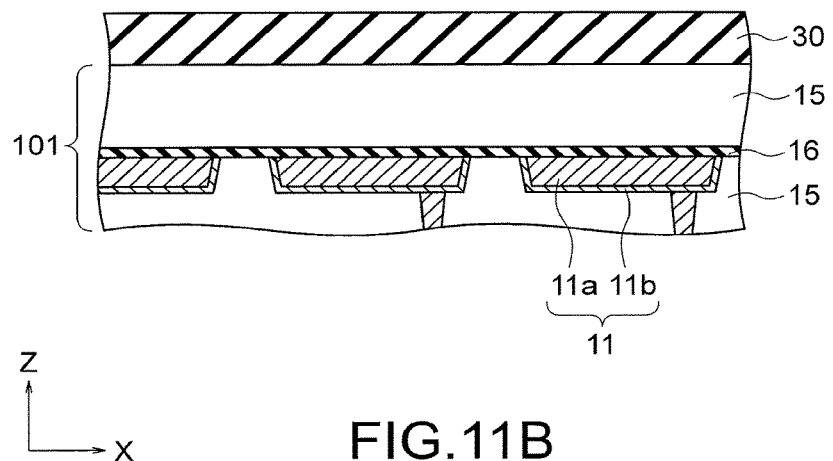
FIG. 11B is a cross-sectional view illustrating a process of forming the resist on the interlayer dielectric film.

Next, the resist 30 is formed on the interlayer dielectric film 15, as illustrated in FIG. 11B.

Figure 11C:
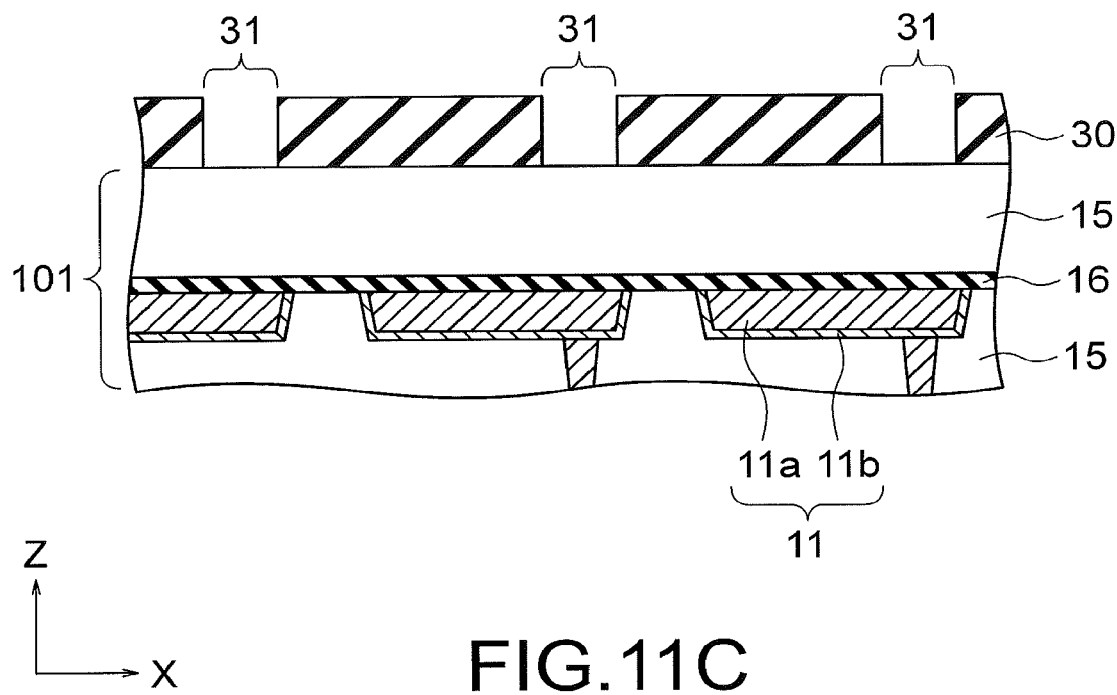
FIG. 11C is a cross-sectional view illustrating a process of forming a pattern including the concave portion in the resist.

Next, a pattern including the concave portion 31 is formed in the resist 30 by lithography, as illustrated in FIG. 11C. The concave portion 31 is located above an area in the interlayer dielectric film 15 where the first dummy pad 14 is to be formed.

Figure 11D:
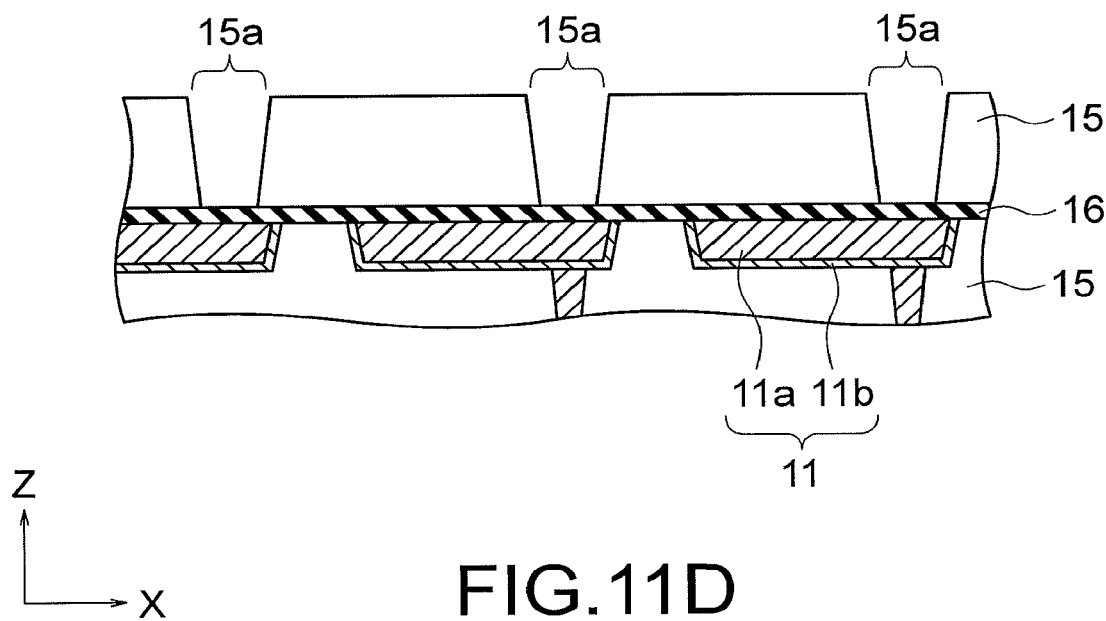
FIG. 11D is a cross-sectional view illustrating a process of removing the interlayer dielectric film using the resist as a mask.

Next, dry etching is performed by using the resist 30 as a mask to remove the interlayer dielectric film 15 until the stopper film 16 is exposed, as illustrated in FIG. 11D. Accordingly, the concave portion 15a for forming the first dummy pad 14 is formed in the interlayer dielectric film 15.

Figure 11E:
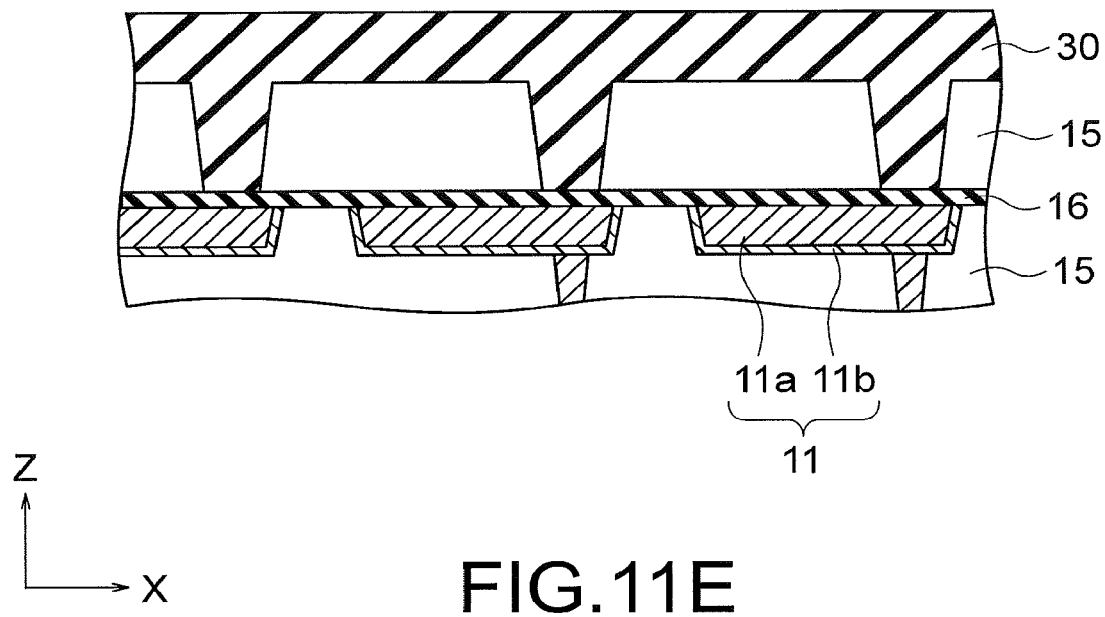
FIG. 11E is a cross-sectional view illustrating a process of forming the resist on the interlayer dielectric film again.

Next, the resist 30 is formed on the interlayer dielectric film 15 again, as illustrated in FIG. 11E. At this time, the resist 30 is embedded in the concave portion 15a.

Figure 11F:
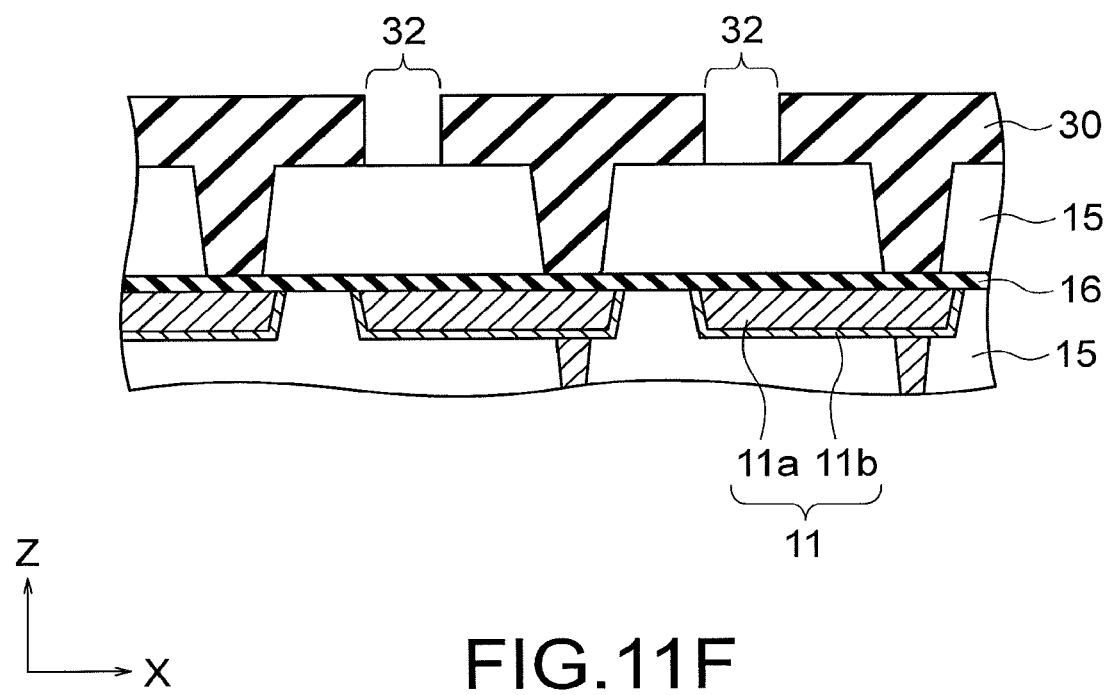
FIG. 11F is a cross-sectional view illustrating a process of forming a pattern including the concave portion in the resist.

Next, a pattern including the concave portion 32 is formed in the resist 30 by lithography, as illustrated in FIG. 11F. The concave portion 32 is located above an area in the interlayer dielectric film 15 where the first connection pad 13 is to be formed.

Figure 11G:
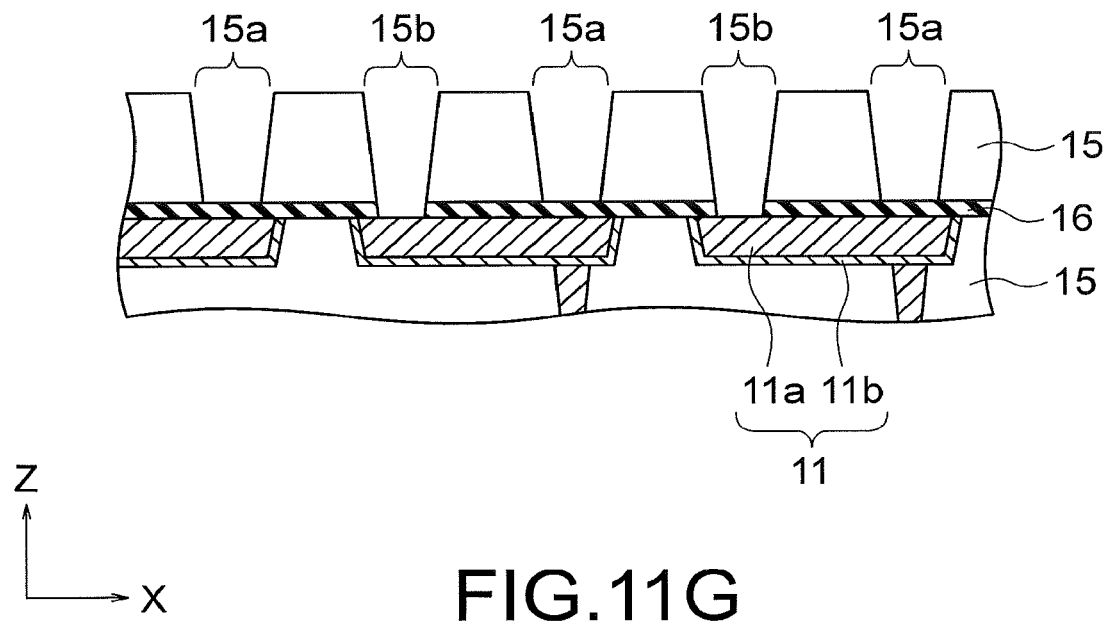
FIG. 11G is a cross-sectional view illustrating a process of removing the interlayer dielectric film and the stopper film using the resist as a mask.

Next, dry etching is performed by using the resist 30 as a mask to remove the interlayer dielectric film 15 and the stopper film 16 until the first wire 11 is exposed, as illustrated in FIG. 11G. Accordingly, the concave portion 15b for forming the first connection pad 13 is formed in the interlayer dielectric film 15. At this time, the resist 30 embedded in the concave portion 15a is removed, so that the concave portion 15a is exposed again.

Figure 11H:
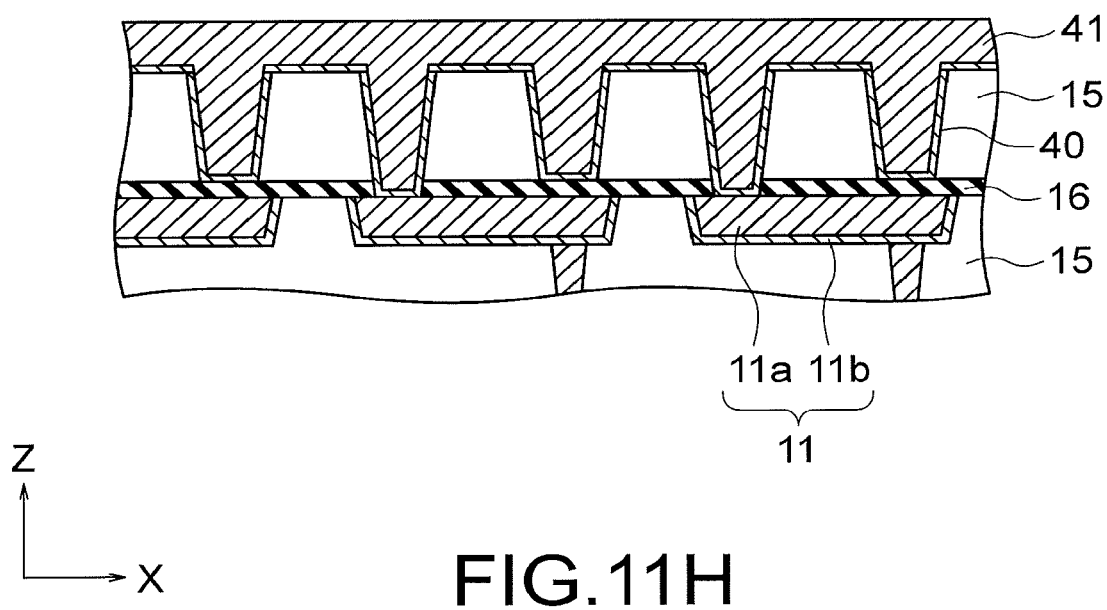
FIG. 11H is a cross-sectional view illustrating a process of forming the barrier metal and then embedding the metal film.

Next, the barrier metal 40 is formed on surfaces of the concave portions 15a and 15b, and the metal film 41 is then embedded in the concave portions 15a and 15b, as illustrated in FIG. 11H. For example, the barrier metal 40 is a tantalum nitride film and the metal film 41 is a copper film.

Figure 11I:
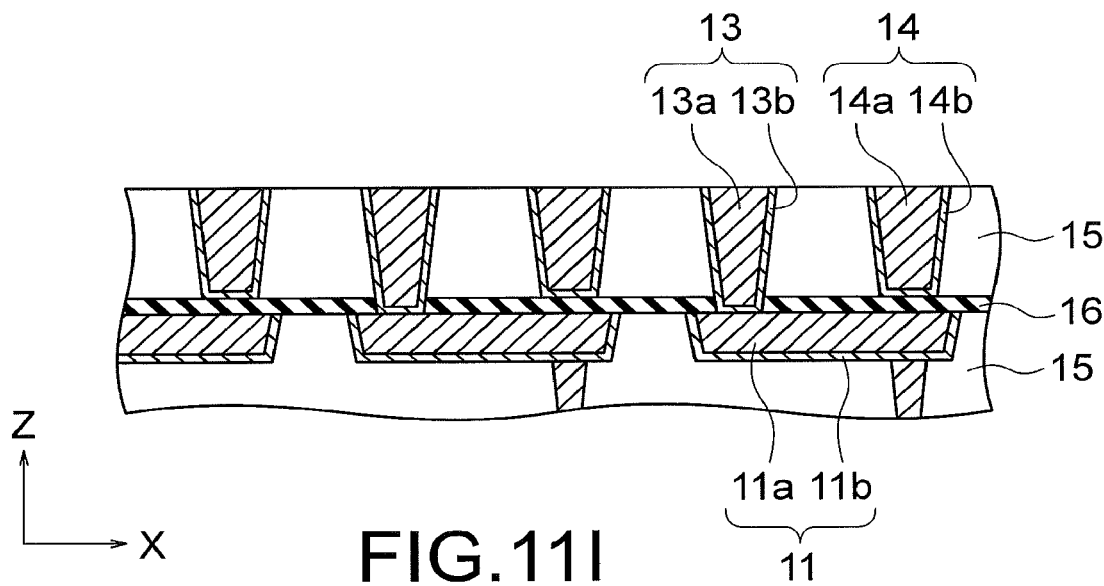
FIG. 11I is a cross-sectional view illustrating a process of removing extra portions of the metal film and the barrier metal.

Next, as illustrated in FIG. 11I, the CMP process is performed to remove extra portions of the metal film 41 and the barrier metal 40 and to remove the interlayer dielectric film 15 by, for example, 100 nm. Consequently, the first connection pad 13 and the first dummy pad 14 are formed in the interlayer dielectric film 15. In the present embodiment, it is possible to prevent generation of a step in the CMP process because of the presence of the first dummy pad 14.

Figure 11J:
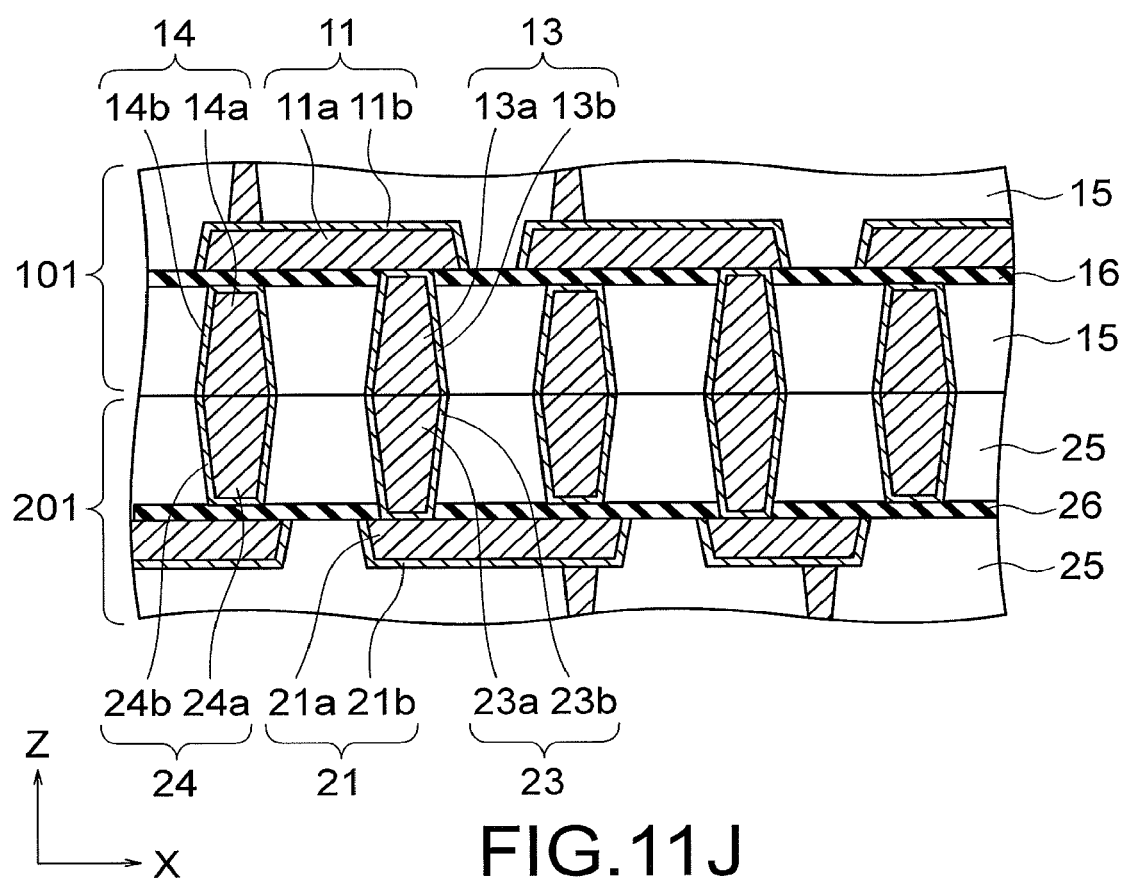
FIG. 11J is a cross-sectional view illustrating a process of bonding the array wafer to the circuit wafer.

Next, as illustrated in FIG. 11J, the array wafer 101 is inverted by 180 degrees and is bonded to the circuit wafer 201. Thereafter, the first connection pad 13 and the first dummy pad 14 of the array wafer 101 are joined to the second connection pad 23 and the second dummy pad 24 of the circuit wafer 201 by heat treatment, respectively. The second connection pad 23 and the second dummy pad 24 are formed in an identical manner to the first connection pad 13 and the first dummy pad 14 described above, before being bonded to the array wafer 101.

Thereafter, the array wafer 101 and the circuit wafer 201 bonded to each other are subjected to dicing, so that a semiconductor device having a via-less structure is completed.

According to the present embodiment, as in the fifth embodiment, the first dummy pad 14 is formed in a step other than a step of forming the first connection pad 13. Therefore, it is possible to make the thickness of the first dummy pad 14 smaller than the thickness of the first connection pad 13. Further, the second dummy pad 24 is also formed in an identical manner to the first dummy pad 14 and thus it is possible to make the thickness of the second dummy pad 24 smaller than the thickness of the second connection pad 23. Furthermore, according to the present embodiment, the thickness of a dummy pad is made smaller than the thickness of a connection pad by forming the dummy pad and the connection pad in separate steps from each other in both the array wafer 101 and the circuit wafer 201. Alternatively, by forming the dummy pad and the connection pad in separate steps from each other in only either the array wafer 101 or the circuit wafer 201, the thickness of the dummy pad may be made smaller than the thickness of the connection pad in only either one of the wafers.

Also in the present embodiment, the stopper films 16 and 26 are used for forming the first dummy pad 14 and the second dummy pad 24, as in the fifth embodiment. However, it is also allowable that the stopper films 16 and 26 are not used. In this case, it is possible to control the thicknesses of the first dummy pad 14 and the second dummy pad 24 by adjusting an etching time of the interlayer dielectric film 15.

Seventh Embodiment

In a seventh embodiment, another example of a manufacturing method of a semiconductor device having a via-less structure is described with reference to FIGS. 12A to 12G.

Figure 12A:
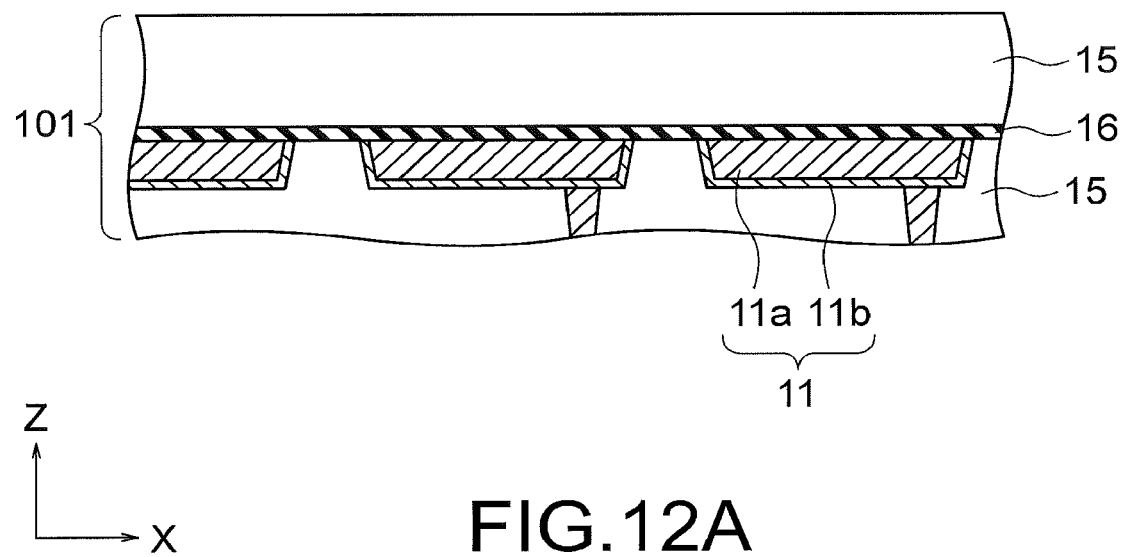
FIG. 12A is a cross-sectional view illustrating a process of stacking the stopper film and the interlayer dielectric film.

First, as illustrated in FIG. 12A, the stopper film 16 and the interlayer dielectric film 15 are stacked on the first wire 11 of the array wafer 101. The stopper film 16 is a silicon nitride film having a thickness of 50 nm, for example. The interlayer dielectric film 15 is a silicon oxide film having a thickness of 550 nm, for example.

Figure 12B:
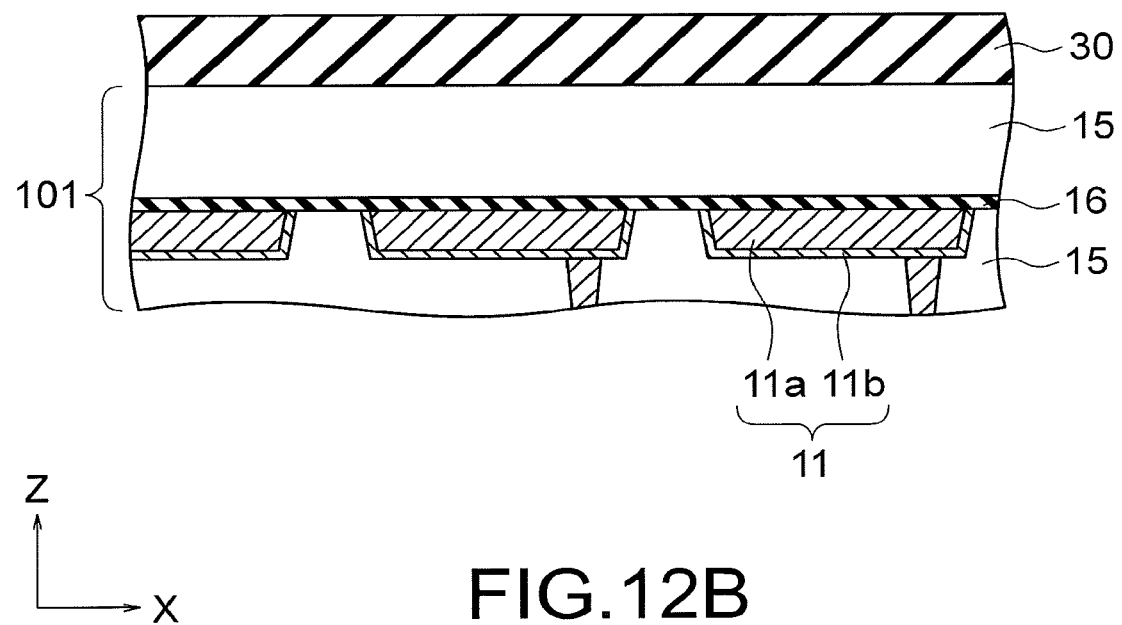
FIG. 12B is a cross-sectional view illustrating a process of forming the resist on the interlayer dielectric film.

Next, the resist 30 is formed on the interlayer dielectric film 15, as illustrated in FIG. 12B.

Figure 12C:
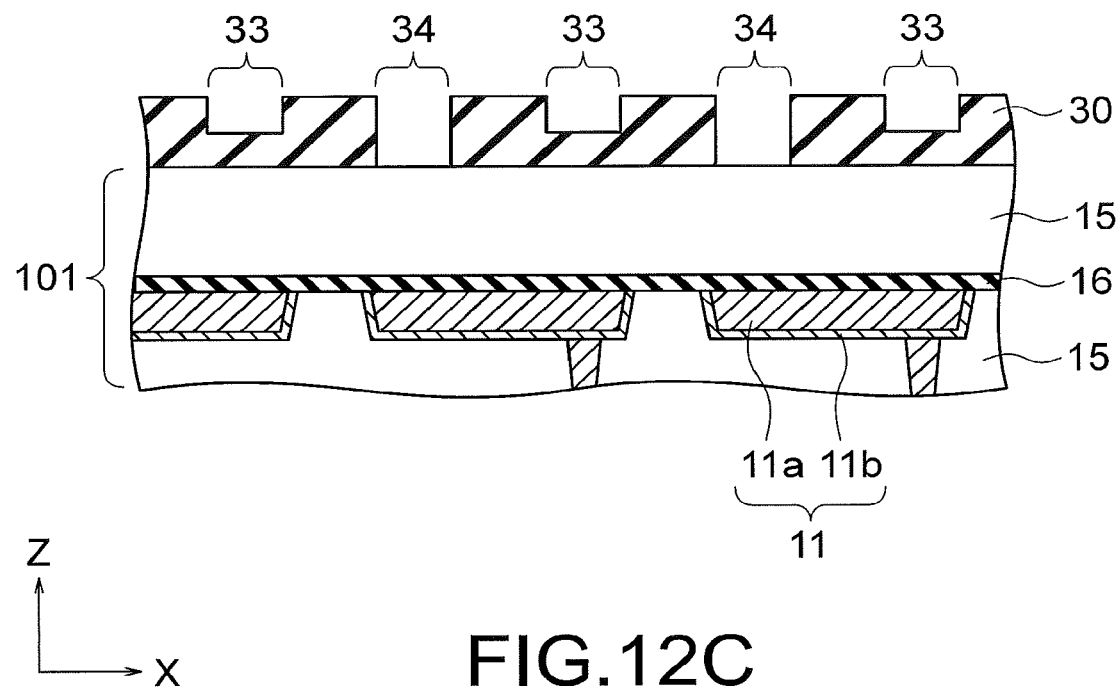
FIG. 12C is a cross-sectional view illustrating a process of forming patterns including two type of concave portions with different depths from each other in the resist at the same time.

Next, patterns including a concave portion 33 and a concave portion 34 are formed in the resist 30 at the same time by gray-scale lithography, as illustrated in FIG. 12C. The concave portion 33 is located above an area in the interlayer dielectric film 15 where the first dummy pad 14 is to be formed. Meanwhile, the concave portion 34 is located above an area in the interlayer dielectric film 15 where the first connection pad 13 is to be formed. In more detail, the concave portions 33 and 34 are formed by lithography that uses photomask in which a transmittance corresponding to the concave portion 33 is smaller than a transmittance corresponding to the concave portion 34, in such a manner that the resist 30 is thicker in the concave portion 33 than in the concave portion 34.

Figure 12D:
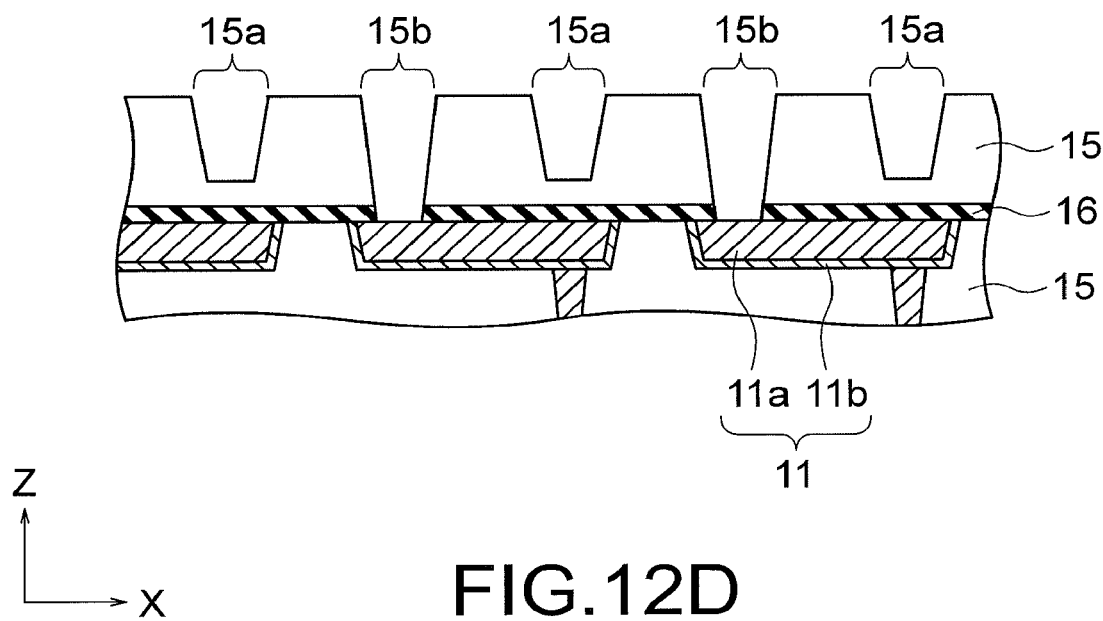
FIG. 12D is a cross-sectional view illustrating a process of removing the interlayer dielectric film using the resist as a mask.

Next, dry etching is performed by using the resist 30 as a mask to remove the interlayer dielectric film 15, as illustrated in FIG. 12D. Accordingly, the concave portion 15a and the concave portion 15b are formed in the interlayer dielectric film 15 at the same time. The concave portion 15a does not reach the stopper film 16 and terminates within the interlayer dielectric film 15. Meanwhile, the concave portion 15b penetrates through the stopper film 16 and reaches the metal film 11a.

Figure 12E:
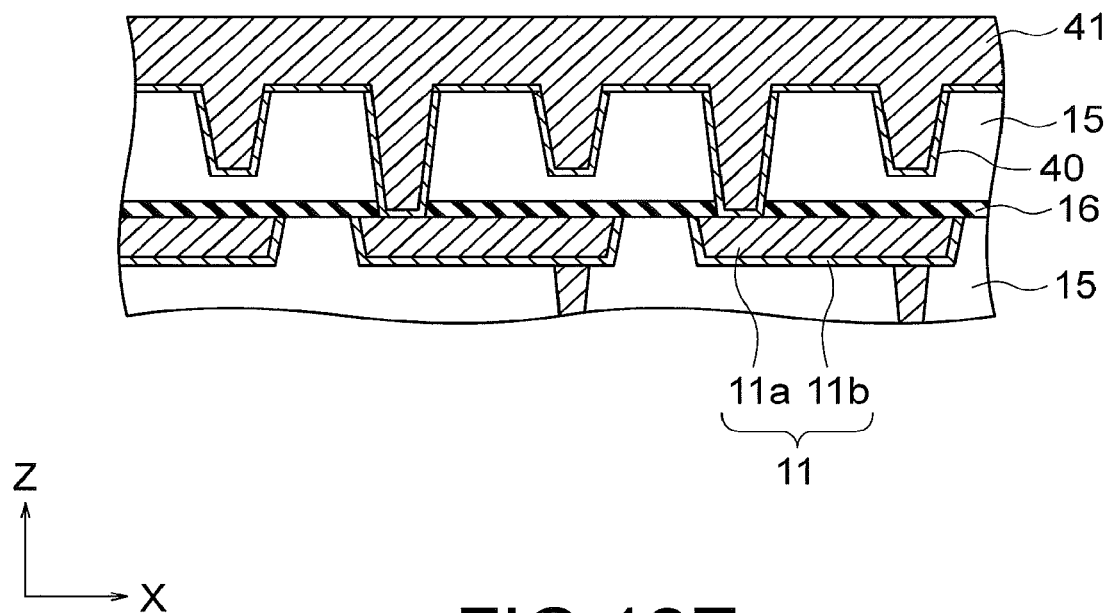
FIG. 12E is a cross-sectional view illustrating a process of forming the barrier metal and then embedding the metal film.

Next, the barrier metal 40 is formed on surfaces of the concave portions 15a and 15b, and the metal film 41 is then embedded in the concave portions 15a and 15b, as illustrated in FIG. 12E. For example, the barrier metal 40 is a tantalum nitride film and the metal film 41 is a copper film.

Figure 12F:
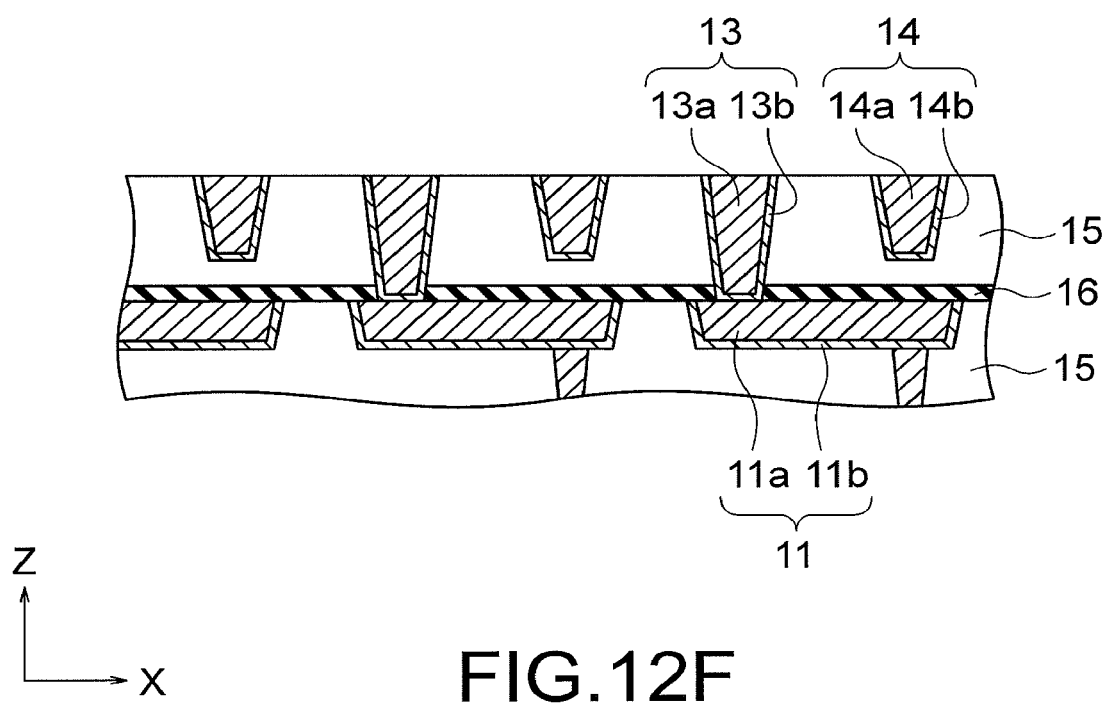
FIG. 12F is a cross-sectional view illustrating a process of removing extra portions of the metal film and the barrier metal.

Next, as illustrated in FIG. 12F, the CMP process is performed to remove extra portions of the metal film 41 and the barrier metal 40 and to remove the interlayer dielectric film 15 by, for example, 100 nm. Consequently, the first connection pad 13 and the first dummy pad 14 are formed in the interlayer dielectric film 15. In the present embodiment, it is possible to prevent generation of a step in the CMP process because of the presence of the first dummy pad 14.

Figure 12G:
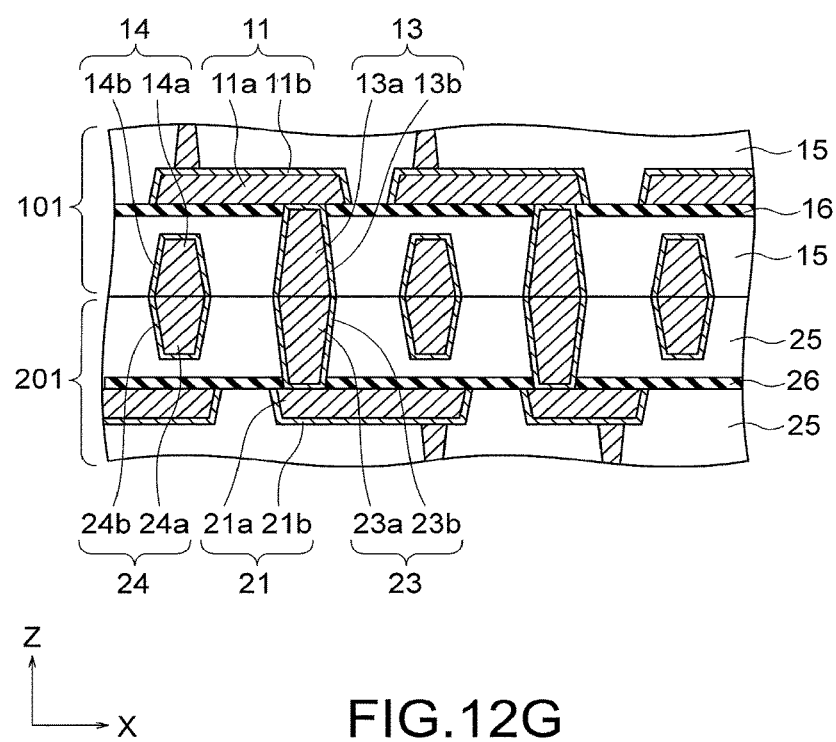
FIG. 12G is a cross-sectional view illustrating a process of bonding the array wafer to the circuit wafer.

Next, as illustrated in FIG. 12G, the array wafer 101 is inverted by 180 degrees and is bonded to the circuit wafer 201. Thereafter, the first connection pad 13 and the first dummy pad 14 of the array wafer 101 are joined to the second connection pad 23 and the second dummy pad 24 of the circuit wafer 201 by heat treatment, respectively. The second connection pad 23 and the second dummy pad 24 are formed in an identical manner to the first connection pad 13 and the first dummy pad 14 described above, before being bonded to the array wafer 101.

Thereafter, the array wafer 101 and the circuit wafer 201 bonded to each other are subjected to dicing, so that another semiconductor device having a via-less structure is completed. This semiconductor device corresponds to the semiconductor device 2 according to the second embodiment illustrated in FIG. 4.

According to the present embodiment, the concave portion 15a for the first dummy pad 14 and the concave portion 15b for the first connection pad 13 are formed at the same time by patterning the resist 30 by gray-scale lithography. Accordingly, a manufacturing time can be reduced as compared with that in the sixth embodiment described above. A method of patterning the resist 30 is not limited to gray-scale lithography. For example, a nanoimprint technique that presses a template having a concave/convex pattern against a resist may be used. Also in this case, it is possible to form the concave portion 15a and the concave portion 15b at the same time by pressing a template that has a pattern having two types of concave portions with different depths from each other against the resist 30. Further, according to the present embodiment, the thickness of a dummy pad is made smaller than the thickness of a connection pad by using gray-scale lithography in both the array wafer 101 and the circuit wafer 201. Alternatively, by using gray-scale lithography in only either the array wafer 101 or the circuit wafer 201, the thickness of the dummy pad may be made smaller than the thickness of the connection pad in only either one of the wafers.

In addition, in the present embodiment, a manufacturing method of a semiconductor device having a via-less structure is described, in which the first wire 11 and the first connection pad 13 are connected directly to each other not via the first contact via 12. However, the present embodiment may be applied to a manufacturing method of a semiconductor device having a structure in which the first wire 11 and the first connection pad 13 are connected to each other via the first contact via 12.

Eighth Embodiment

In an eighth embodiment, a still another example of a manufacturing method of a semiconductor device having a via-less structure is described with reference to FIGS. 13A to 13G.

Figure 13A:
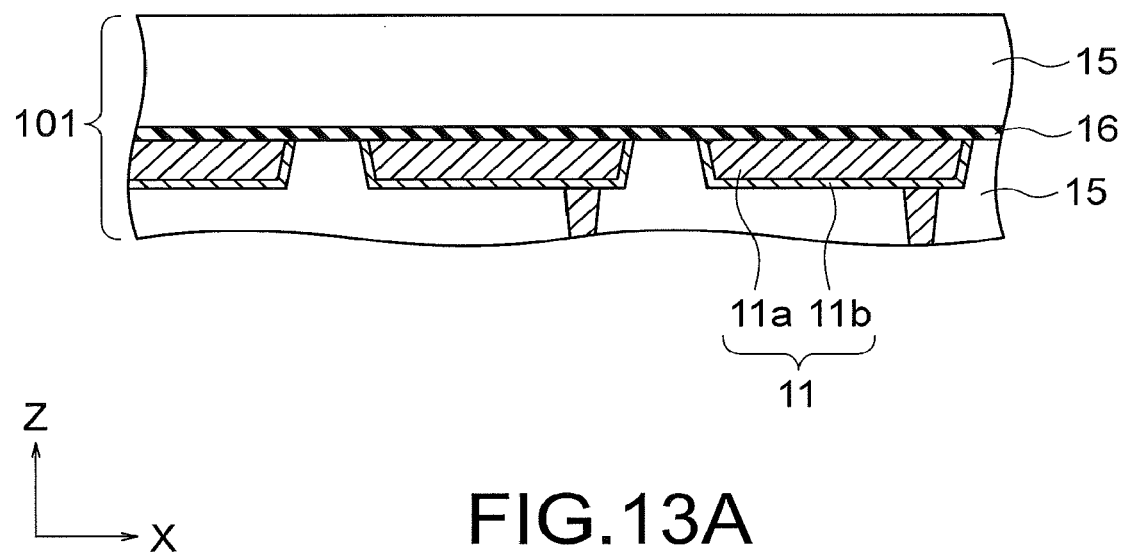
FIG. 13A is a cross-sectional view illustrating a process of stacking the stopper film and the interlayer dielectric film.

First, as illustrated in FIG. 13A, the stopper film 16 and the interlayer dielectric film 15 are stacked on the first wire 11 of the array wafer 101. The stopper film 16 is a silicon nitride film having a thickness of 30 nm, for example. The interlayer dielectric film 15 is a silicon oxide film having a thickness of 600 nm, for example.

Figure 13B:
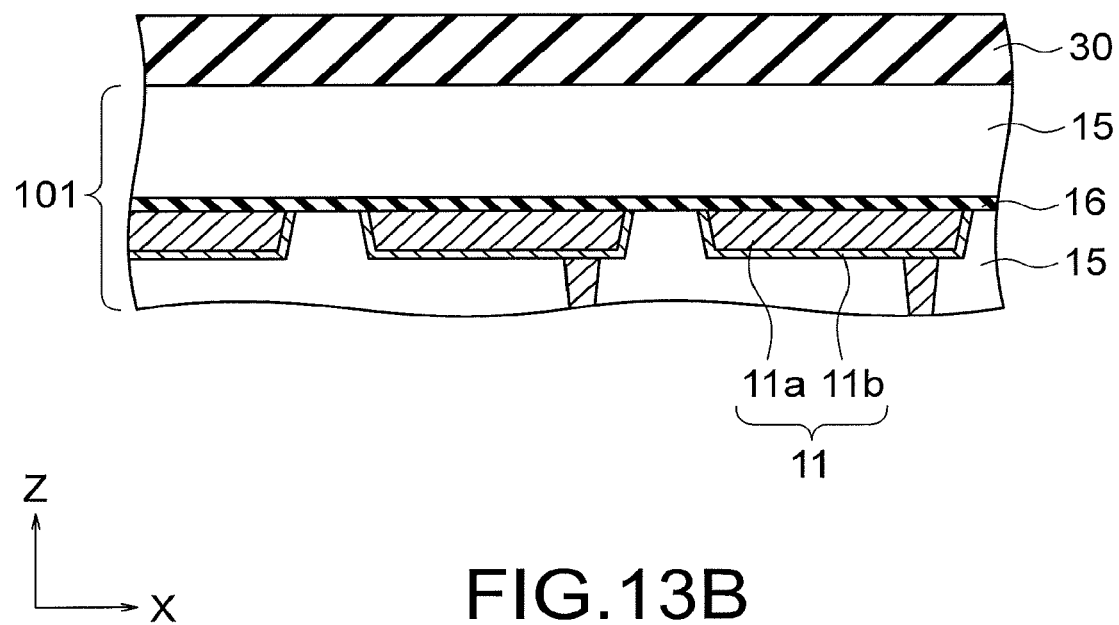
FIG. 13B is a cross-sectional view illustrating a process of forming the resist on the interlayer dielectric film.

Next, the resist 30 is formed on the interlayer dielectric film 15, as illustrated in FIG. 13B.

Figure 13C:
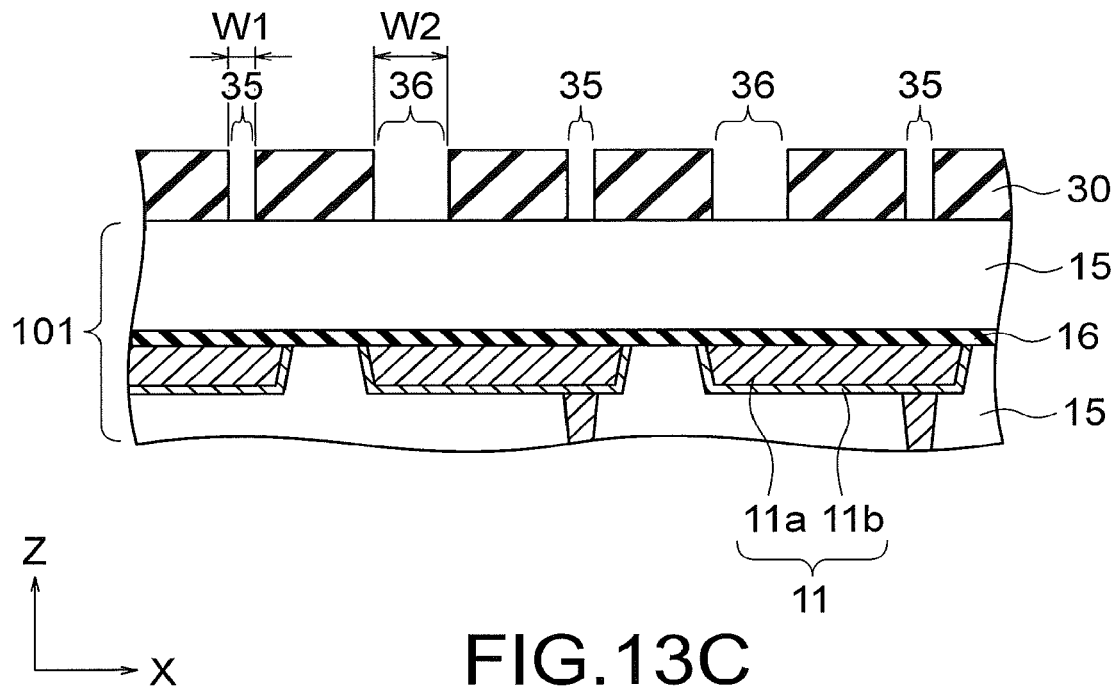
FIG. 13C is a cross-sectional view illustrating a process of forming patterns including two type of concave portions with different opening widths from each other in the resist at the same time.

Next, patterns including a concave portion 35 and a concave portion 36 are formed in the resist 30 at the same time by lithography, as illustrated in FIG. 13C. The concave portion 35 is located above an area in the interlayer dielectric film 15 where the first dummy pad 14 is to be formed. Meanwhile, the concave portion 36 is located above an area in the interlayer dielectric film 15 where the first connection pad 13 is to be formed. Further, an opening width W1 in the X-direction of the concave portion 35 is smaller than an opening width W2 in the X-direction of the concave portion 36. For example, the opening width W1 is 0.3 μm and the opening width W2 is 1 μm.

Figure 13D:
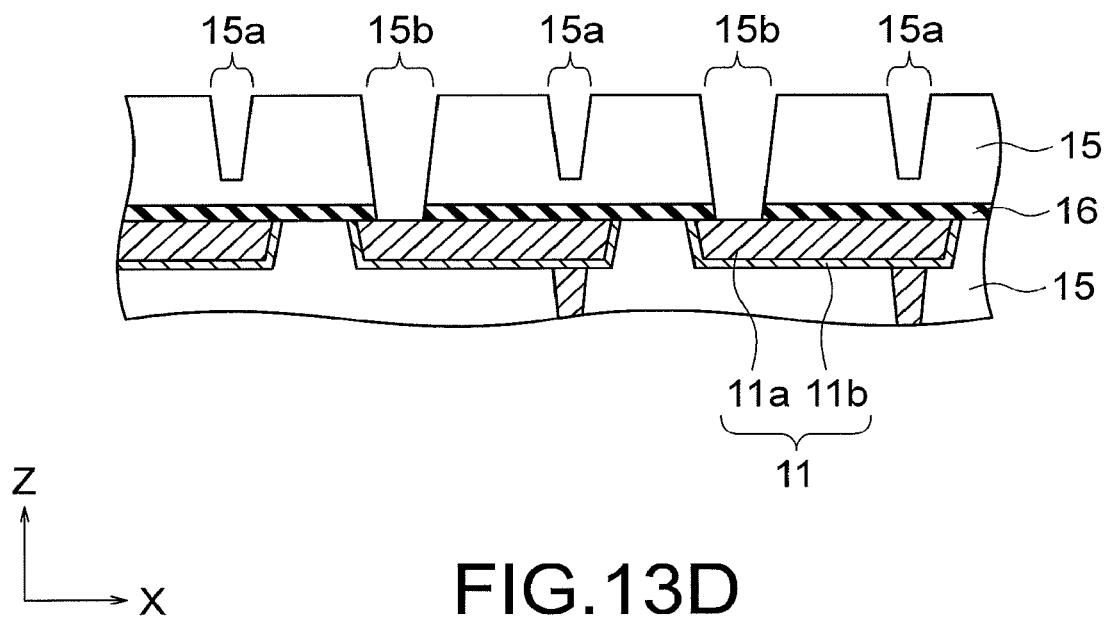
FIG. 13D is a cross-sectional view illustrating a process of removing the interlayer dielectric film using the resist as a mask.

Next, dry etching is performed by using the resist 30 as a mask to remove the interlayer dielectric film 15, as illustrated in FIG. 13D. Accordingly, the concave portion 15a and the concave portion 15b are formed in the interlayer dielectric film 15 at the same time. In the present embodiment, the opening width W1 of the concave portion 35 formed in the resist 30 is smaller than the opening width W2 of the concave portion 36 as described above. Therefore, because of a loading effect, while the concave portion 15a terminates within the interlayer dielectric film 15, the concave portion 15b penetrates through the interlayer dielectric film 15 and the stopper film 16 and reaches the metal film 11a.

Figure 13E:
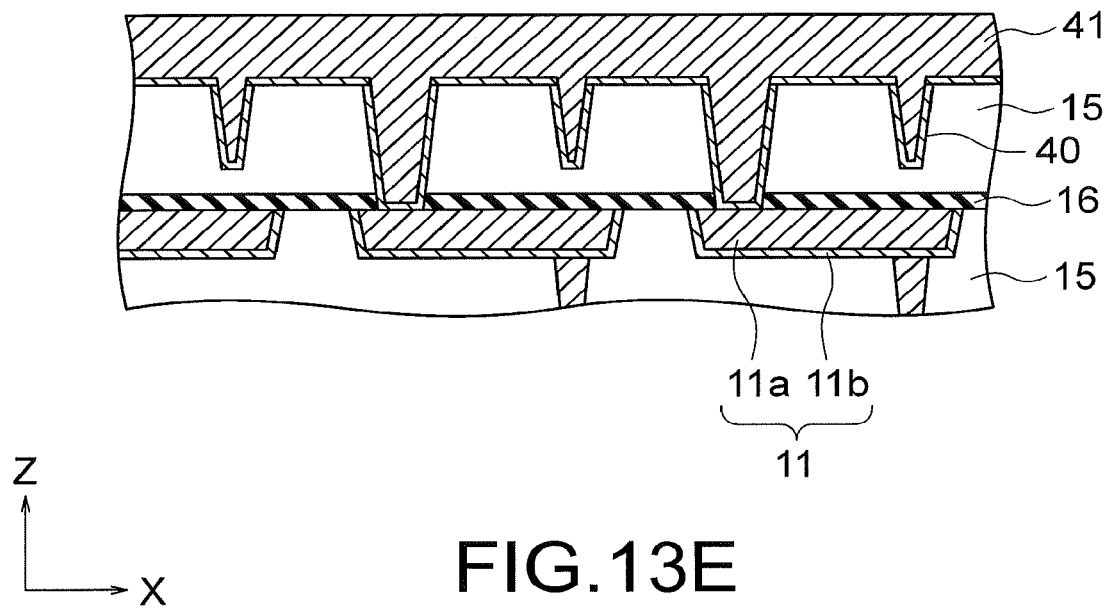
FIG. 13E is a cross-sectional view illustrating a process of forming the barrier metal and then embedding the metal film.

Next, the barrier metal 40 is formed on surfaces of the concave portions 15a and 15b, and the metal film 41 is then embedded in the concave portions 15a and 15b, as illustrated in FIG. 13E. For example, the barrier metal 40 is a tantalum nitride film and the metal film 41 is a copper film.

Figure 13F:
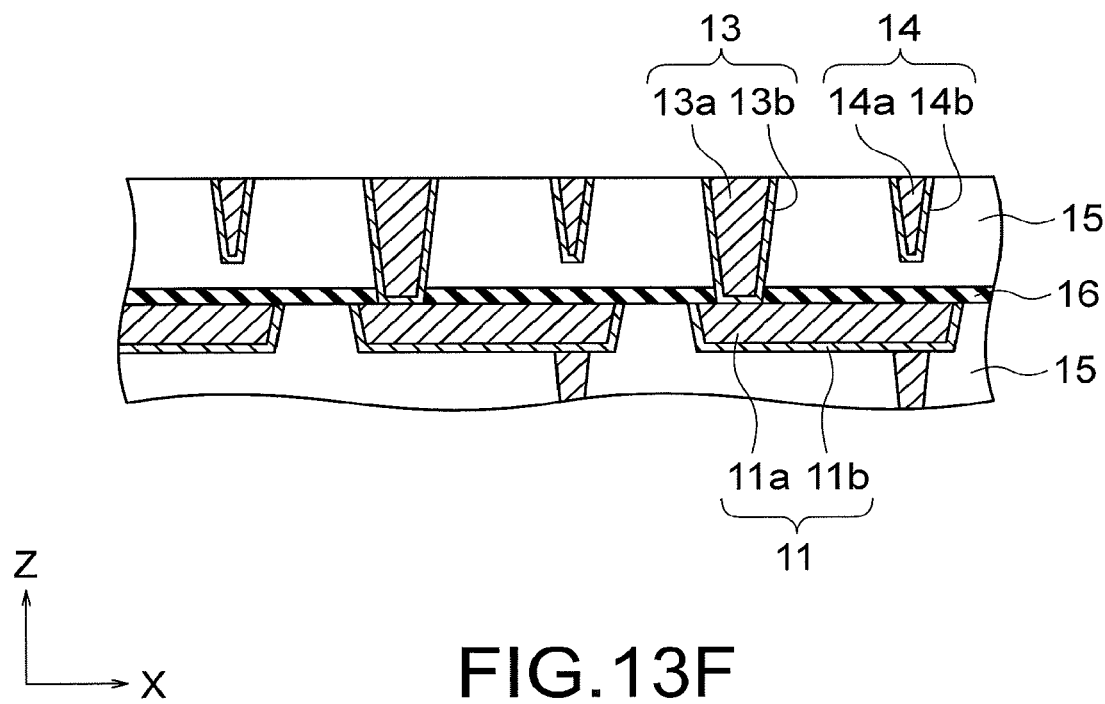
FIG. 13F is a cross-sectional view illustrating a process of removing extra portions of the metal film and the barrier metal.

Next, as illustrated in FIG. 13F, the CMP process is performed to remove extra portions of the metal film 41 and the barrier metal 40 and to remove the interlayer dielectric film 15 by, for example, 100 nm. Consequently, the first connection pad 13 and the first dummy pad 14 are formed in the interlayer dielectric film 15. In the present embodiment, it is possible to prevent generation of a step in the CMP process because of the presence of the first dummy pad 14.

Figure 13G:
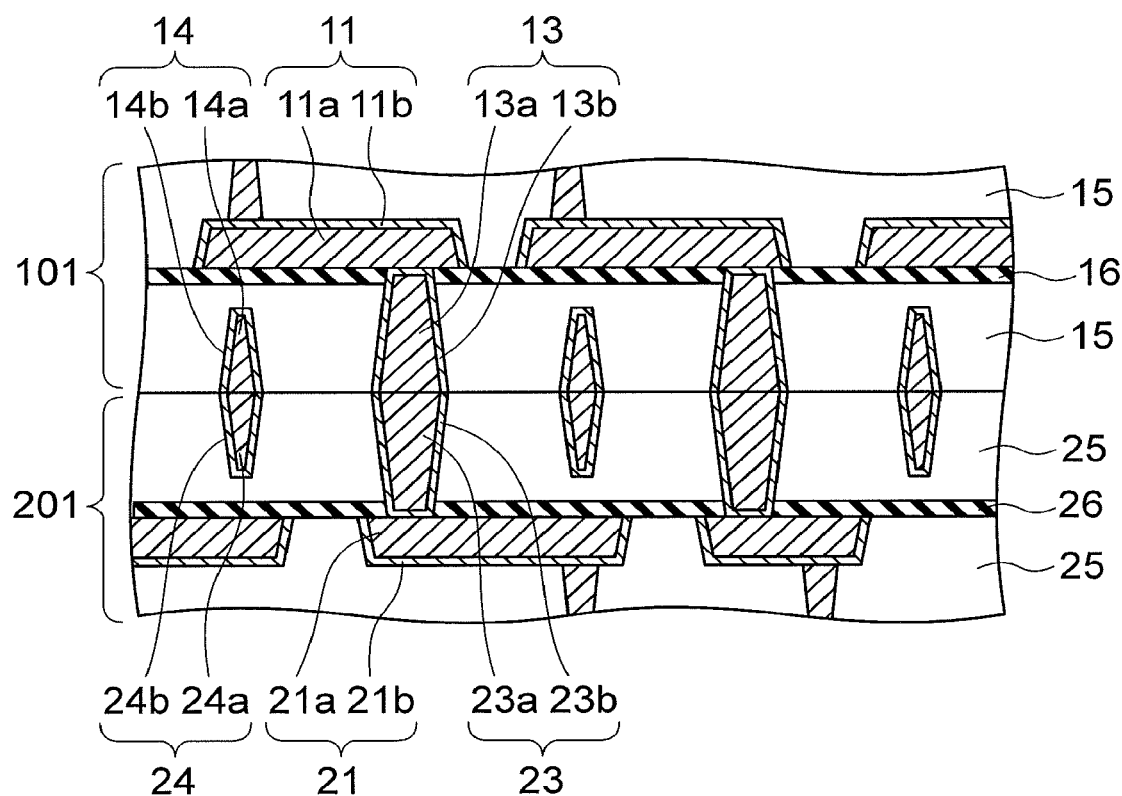
FIG. 13G is a cross-sectional view illustrating a process of bonding the array wafer to the circuit wafer.

Next, as illustrated in FIG. 13G, the array wafer 101 is inverted by 180 degrees and is bonded to the circuit wafer 201. Thereafter, the first connection pad 13 and the first dummy pad 14 of the array wafer 101 are joined to the second connection pad 23 and the second dummy pad 24 of the circuit wafer 201 by heat treatment, respectively. The second connection pad 23 and the second dummy pad 24 are formed in an identical manner to the first connection pad 13 and the first dummy pad 14 described above, before being bonded to the array wafer 101.

Thereafter, the array wafer 101 and the circuit wafer 201 bonded to each other are subjected to dicing, so that still another semiconductor device having a via-less structure is completed. In this semiconductor device, the area of joining of the first dummy pad 14 and the second dummy pad 24 is smaller than the area of joining of the first connection pad 13 and the second connection pad 23.

According to the present embodiment, the concave portions 35 and 36 having different widths from each other are formed in the resist 30 at the same time. Further, in dry etching using the resist 30 as a mask, the depth of the concave portion 15a for the first dummy pad 14 is smaller than the depth of the concave portion 15b for the first connection pad 13 because of a loading effect. As a result, the first dummy pad 14 having a smaller thickness than the first connection pad 13 can be formed by one lithography process and one dry etching process. Furthermore, according to the present embodiment, the thickness of a dummy pad is made smaller than the thickness of a connection pad by using a loading effect in both the array wafer 101 and the circuit wafer 201. Alternatively, by using a dry etching condition that provides a larger loading effect in either one of wafers and a dry etching condition that provides a smaller loading effect in the other wafer, the thickness of the dummy pad may be made smaller than the thickness of the connection pad in only either one of the wafers.

In the present embodiment, a manufacturing method of a semiconductor device having a via-less structure has been described, in which the first wire 11 and the first connection pad 13 are connected directly to each other not via the first contact via 12. However, the present embodiment may be also applied to a manufacturing method of a semiconductor device having a structure in which the first wire 11 and the first connection pad 13 are connected to each other via the first contact via 12.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A manufacturing method of a semiconductor device, comprising:

forming a plurality of concave portions in an interlayer dielectric film formed on a first wire provided on a first wafer and embedding a metal into the concave portions, to form a first connection pad electrically connected to the first wire and a first dummy pad;

firming a plurality of concave portions in an interlayer dielectric film formed on a second wire provided on a second water and embedding a metal into the concave portions, to form a second connection pad electrically connected to the second wire and a second dummy pad; and joining the first connection pad and the second connection pad to each other and joining the first dummy pad and the second dummy pad to each other, wherein the concave portions are formed such that a thickness of the first dummy pad is smaller than a thickness of the first connection pad and a thickness of the second dummy pad is also smaller than a thickness of the second connection pad, or the thickness of the first dummy pad is smaller than the thickness of the first connection pad or the thickness of the second dummy pad is smaller than the thickness of the second connection pad, and a resist is formed on the interlayer dielectric film formed on the first wire, patterns including two types of concave portions with different depths from each other are formed in the resist by gray-scale lithography at a same time, and the interlayer dielectric film formed on the first wire is etched by using the resist as a mask.

2. A manufacturing method of a semiconductor device, comprising:

forming a plurality of concave portions in an interlayer dielectric film formed on a first wire provided on a first water and embedding a metal into the concave portions, to form a first connection pad electrically connected to the first wire and a first dummy pad, forming a plurality of concave portions in an interlayer dielectric film formed on a second wire provided on a second wafer and embedding a metal into the concave portions, to form a second connection pad electrically connected to the second wire and a second dummy pad; and joining the first connection pad and the second connection pad to each other and joining the first dummy pad and the second dummy pad to each other, wherein the concave portions are formed such that a thickness of the first dummy pad is smaller than a thickness of the first connection pad and a thickness of the second dummy pad is also smaller than a thickness of the second connection pad, or the thickness of the first dummy pad is smaller than the thickness of the first connection pad or the thickness of the second dummy pad is smaller than the thickness of the second connection pad, and a resist is formed on the interlayer dielectric film formed on the first wire, patterns including two types of concave portions with different depths from each other are formed in the resist by a nanoimprint technique at a same time, and the interlayer dielectric film formed on the first wire is etched by using the resist as a mask.

3. A manufacturing method of a semiconductor device, comprising:

forming a plurality of concave portions in an interlayer dielectric film formed on a first wire provided on a first water and embedding a metal into the concave portions, to form a first connection pad electrically connected to the first wire and a first dummy pad;

forming a plurality of concave portions in an interlayer dielectric film formed on a second wire provided on a second wafer and embedding a metal into the concave portions, to form a second connection pad electrically connected to the second wire and a second dummy pad; and joining the first connection pad and the second connection pad to each other and joining the first dummy pad and the second dummy pad to each other, wherein the concave portions are formed such that a thickness of the first dummy pad is smaller than a thickness of the first connection pad and a thickness of the second dummy pad is also smaller than a thickness of the second connection pad, or the thickness of the first dummy pad is smaller than the thickness of the first connection pad or the thickness of the second dummy pad is smaller than the thickness of the second connection pad, and a resist is formed on the interlayer dielectric film on the first wire, patterns including two types of concave portions with different opening widths from each other are formed in the resist at a same time, and the interlayer dielectric film on the first wire is etched by using the resist as a mask.

* * * * *